US012783747B2

(12) United States Patent
Rook et al.

(10) Patent No.: US 12,783,747 B2
(45) Date of Patent: Nov. 3, 2026

(54) INTERACTIVE TOOL FOR SELECTING BUILDING CONFIGURATIONS AND LOTS FOR NEW HOMES

(71) Applicant: Hayden Homes, Redmond, OR (US)

(72) Inventors: Judd Rook, Redmond, OR (US); Garrett Genz, Redmond, OR (US)

(73) Assignee: Hayden Homes, Redmond, OR (US)

( * ) Notice: Subject to any disclaimer, the term of this patent is extended or adjusted under 35 U.S.C. 154(b) by 0 days.

(21) Appl. No.: 19/055,440

(22) Filed: Feb. 17, 2025

(65) Prior Publication Data

US 2026/0023888 A1 Jan. 22, 2026

Related U.S. Application Data

(60) Provisional application No. 63/674,220, filed on Jul. 22, 2024.

(51) Int. Cl.
*G06F 30/13* (2020.01)
*G06F 3/0482* (2013.01)

(52) U.S. Cl.
CPC ............ *G06F 30/13* (2020.01); *G06F 3/0482* (2013.01)

(58) Field of Classification Search
CPC .... G06Q 50/16; G06Q 50/163; G06Q 50/165; G06F 30/13
See application file for complete search history.

(56) References Cited

U.S. PATENT DOCUMENTS

| | | | | |
|---|---|---|---|---|
| 7,827,069 | B2 * | 11/2010 | King | G06Q 50/167 705/37 |
| 8,583,562 | B1 * | 11/2013 | McDaniel | G06Q 10/10 705/313 |
| 10,565,665 | B2 * | 2/2020 | Zabala Rodriguez | G06Q 50/26 |
| 11,157,848 | B2 | 10/2021 | Scholar | |
| 11,244,412 | B1 * | 2/2022 | Phillips | G06Q 30/0641 |
| 12,165,229 | B1 * | 12/2024 | Carroll | G06F 18/214 |
| 2006/0167701 | A1 * | 7/2006 | Horimoto | G06Q 40/02 705/26.1 |
| 2008/0120363 | A1 * | 5/2008 | Loveland | G06Q 50/16 709/203 |
| 2010/0070244 | A1 * | 3/2010 | Nicolucci | G06Q 50/16 715/764 |

(Continued)

OTHER PUBLICATIONS

Ahmad, Irtishad, Salman Azhar, and Pranas Lukauskis. "Development of a decision support system using data warehousing to assist builders/developers in site selection." Automation in construction 13.4 (2004): 525-542 (Year: 2004).*

(Continued)

*Primary Examiner* — David A Hopkins
(74) *Attorney, Agent, or Firm* — Klarquist Sparkman, LLP

(57) ABSTRACT

Systems and methods are provided for interactive home design. A method for interactively designing a home includes receiving, from a user, a plurality of user selections for a home design, identifying, based on structural, lot-limiting options selected by the user, a plurality of lots that are at least partially compatible with the lot-limiting options, determining, based on the lot-limiting options, a score for each lot of the plurality of lots that indicates a fit of each lot to user selections, ordering the plurality of lots based on the score for each lot, and displaying, to the user, the ordered plurality of lots.

15 Claims, 19 Drawing Sheets

(56) References Cited

U.S. PATENT DOCUMENTS

| | | | | |
|---|---|---|---|---|
| 2014/0278280 | A1* | 9/2014 | Pardo-Fernandez | G06F 30/13 703/1 |
| 2014/0280069 | A1* | 9/2014 | Schoen | G06F 16/248 707/758 |
| 2015/0228037 | A1* | 8/2015 | Wu | G06Q 50/16 705/313 |
| 2018/0268087 | A1* | 9/2018 | Tierney | G06F 30/13 |
| 2019/0213286 | A1* | 7/2019 | Bauer | G06Q 50/08 |
| 2019/0220759 | A1* | 7/2019 | Tierney | G06T 17/05 |
| 2020/0043110 | A1* | 2/2020 | Kalyanasundaram | G06Q 50/16 |
| 2022/0067856 | A1* | 3/2022 | Jurick | G06Q 50/165 |

OTHER PUBLICATIONS

Albacete, Xavier, Kari Pasanen, and Mikko Kolehmainen. "A GIS-based method for the selection of the location of residence." Geo-spatial Information Science 15.1 (2012): 61-66. Abstract and §§ 1 and 3.1 and fig. 1 (Year: 2012).*

Banai-Kashani, R. (1989). A new method for site suitability analysis: The analytic hierarchy process. Environmental Management, 13 (6), 685-693 (Year: 1989).*

Brennan, Thomas M., and Mohan Venigalla. "A constructability assessment method (CAM) for sustainable division of land parcels." Land Use Policy 56 (2016): 47-57. Abstract, § 1 last three paragraphs. (Year: 2016).*

Cheng, Eddie WL, and Heng Li. "Exploring quantitative methods for project location selection." Building and Environment 39.12 (2004): 1467-1476 (Year: 2004).*

Emekli, Hakan, and Caner Guney. "Toward building a 3D Web-based spatial decision framework for apartment selection." Journal of Housing and the Built Environment 34.3 (2019): 769-789. Abstract, § 1 ¶¶ 1-3; fig. 1; § 2 ¶¶ 2-5; § 4.2 ¶ 1 (Year: 2019).*

Findikaki, Irene. "SISES: An expert system for site selection." Expert systems: Applications to urban planning. New York, NY: Springer New York, 1990. 125-132 (Year: 1990).*

Huang, Chuen-huei. "A Choice Model of Mass Customized Modular Housing by Internet Aided Design." Joint Conference Proceedings of International Mass Customization Meeting 2007 (IMCM'07) and International Conference (Year: 2007).*

Insua Perdomo, German. Architectural rendering and 3D visualization. BS thesis. Universitat Politècnica de Catalunya, 2022 (Year: 2022).*

Kuusela, Verneri. "3D modeling pipeline for games." (2022). Turku University of Applied Sciences. Bachelor's Thesis (Year: 2022).*

Li, Heng, Ling Yu, and Eddie WL Cheng. "A GIS-based site selection system for real estate projects." Construction Innovation 5.4 (2005): 231-241. (Year: 2005).*

Mallick, Javed, et al. "GIS-based decision support system for safe and sustainable building construction site in a mountainous region." Sustainability 14.2 (2022): 888. Abstract, § 1 including p. 2 last two paragraphs, followed by p. 3 ¶¶ 1-2; then p. 3 last paragraph to p. 4 ¶ 2 (Year: 2022).*

Mendadhala, Rohitvenkat Gandhi. Automating Spatial Multi-Criteria Decision Analysis (MCDA) of housing development sites in Richardson, TX using ArcGIS Pro SDK for. Net-An accessibility level perspective. Diss. MSC Thesis, The University of Texas at Dallas, 2018. Abstract, §§ 2.2-23 (Year: 2018).*

Metzenbaum, James. "The History of Zoning—A Thumbnail Sketch." W. Res. L. Rev. 9 (1957): 36 (Year: 1957).*

Paquette, Andrew. Computer graphics for artists: an introduction. London: Springer London, 2008 (Year: 2008).*

Shashi, M., and Kamal Jain. "Use of photogrammetry in 3D modeling and visualization of buildings." ARPN Journal of Engineering and Applied Sciences 2.2 (2007): 37-40 (Year: 2007).*

Stajić, Boris, et al. "3D modeling course at the computer graphics—engineering animation studies." Between Computational Models and Performative Capacities 4th eCAADe International Regional Workshop. 2016 (Year: 2016).*

Ünel, Fatma Bünyan, and ükran Yalpr. "Valuations of building plots using the AHP method." International Journal of Strategic Property Management (2019). Abstract, then see § 1 including ¶¶ 1-3; and p. 200, col. 2, ¶¶ 2-3 (Year: 2019).*

Yuan, Xiaofang, et al. "Toward a user-oriented recommendation system for real estate websites." Information systems 38.2 (2013): 231-243. (Year: 2013).*

* cited by examiner

1000

1300

1400

1700

1900

INTERACTIVE TOOL FOR SELECTING BUILDING CONFIGURATIONS AND LOTS FOR NEW HOMES

CROSS REFERENCE TO RELATED APPLICATION

This application claims the benefit of U.S. Provisional Patent Application No. 63/674,220, filed Jul. 22, 2024, which is incorporated by reference herein.

FIELD

The disclosure relates generally to a project planning system, and particularly to an interactive system for designing a new home.

BACKGROUND

Purchasing a customized single-family home in a new development starts with selecting a lot, which can be limiting because the choices may be constrained by availability and location in the development. After securing a lot, buyers meet with sales representatives to choose a floor plan and architectural style from selections offered by the developer. Buyers often find that their options are somewhat predetermined by design guidelines of the development.

Next, the buyers engage in detailed consultations with a design team to customize the layout, finishes, and fixtures of the home. This stage can be particularly time-consuming, requiring multiple meetings to decide on materials for flooring, countertops, cabinetry, and other features. These interactions ensure the home reflects the preferences of the buyer within the constraints of the selection. Once the design choices are finalized, buyers sign a purchase agreement, formalizing the commitment to proceed with construction.

SUMMARY

Systems and methods are provided for interactive home design that allow a potential homebuyer to customize and personalize a home design, select a suitable lot for their customized home, and purchase the lot and their customized home, all without intervention or consultation by additional parties. A method for interactively designing a home includes receiving, from a user, a plurality of user selections for a home design, and identifying, based on structural, lot-limiting options selected by the user, a plurality of lots that are at least partially compatible with the lot-limiting options. The method further includes determining, based on the lot-limiting options, a score for each lot of the plurality of lots that indicates a fit of each lot to user selections, ordering the plurality of lots based on the score for each lot, and displaying, to the user, the ordered plurality of lots. A database stores information for each lot in a community, including whether a lot can accommodate certain structural options, and is updated as homebuyers design and purchase their homes, which ensures that anti-monotony rules are observed. In this way, homebuyers may quickly and easily proceed through the home design and purchase process without extensive, involved consultation from home builders and designers.

Further, homebuyers can proceed independently with the design process while automatically complying with jurisdictional and regulatory requirements.

The foregoing and other objects, features, and advantages of the invention will become more apparent from the following detailed description, which proceeds with reference to the accompanying figures.

DETAILED DESCRIPTION

The present description relates to systems and methods for an interactive home design tool enabling users to select building configurations and lots for a new home. The interactive home design tool empowers users to make informed decisions regarding the configuration of their future homes. By providing a user-friendly interface, the interactive home design tool allows individuals to explore and select various building layouts and lot options tailored to their preferences and needs. The interactive home design tool streamlines the planning process by offering a comprehensive platform where users can visualize their choices and see how different configurations fit within specific lots. This system not only simplifies the home design journey but also ensures that users can make choices that best align with their vision for a new home.

For example, purchasing a customized single-family home in a new development starts with the home buyer either selecting a lot first, or by selecting a floor plan with structural options first. The starting point is determined by what is most important to the buyer—the lot or the floor plan with structural options. Starting with the lot can be limiting as the choices may be constrained by availability and location in the development. After securing a lot, buyers can choose a floor plan and architectural style from selections that may be accommodated by the lot, though buyers may find that their options are somewhat pre-determined by design guidelines of the development. Starting with the floor plan, the buyer may select structural lot-limiting options without constraint. After selecting a floor plan with structural lot-limiting options, buyers may choose a lot from the selection of lots that can accommodate the floor plan with selected structural lot-limiting options. Buyers may find that their floor plan with selected structural lot-limiting options cannot be built on any of the available lots in the development. The buyer may then select a floor plan with structural lot-limiting options that can be built on at least one lot in the development. If this is not possible, the sale may be lost. The disclosure of the present application simplifies this process by enabling buyers to easily customize a home for a given floor plan, and understand which lots may be available for a given floor plan.

Figure 1:
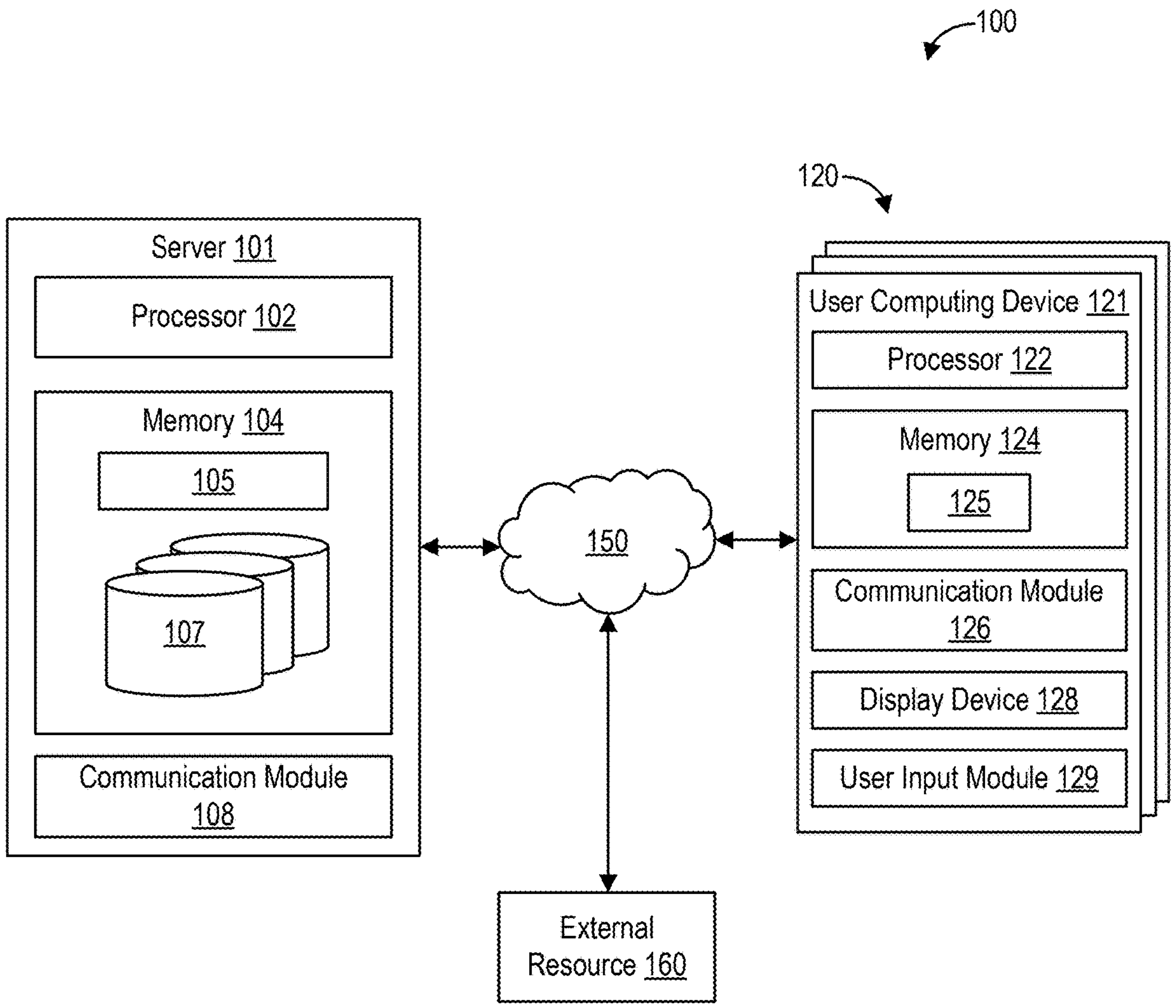
FIG. 1 shows a high-level block diagram illustrating an example system for an interactive home design tool.

FIG. 1 illustrates an example computing environment 100 in accordance with the present disclosure. In particular, computing environment 100 includes a server 101, a plurality of user computing devices 120 including at least one user computing device 121, and a network 150. However, not all of the components illustrated may be used to practice the present disclosure. Variations in the arrangement and type of the components may be made without departing from the spirit or scope of the present disclosure.

Server 101 is a computing device configured to provide an interactive home design tool for use by one or more users. In different embodiments, server 101 may take the form of a mainframe computer, server computer, desktop computer, laptop computer, tablet computer, network computing device, mobile computing device, mobile communication device, and so on.

Server 101 includes a logic subsystem such as processor 102, a data-holding subsystem such as memory 104, and a communication module 108. Server 101 may optionally include a display device (not shown) and/or other components not shown in FIG. 1. For example, server 101 may also optionally include user input devices such as keyboards, mice, game controllers, cameras, microphones, and/or touch screens, as illustrative examples.

Processor 102 may include one or more physical devices configured to execute one or more instructions. For example, processor 102 may be configured to execute one or more instructions that are part of one or more applications, services, programs, routines, libraries, objects, components, data structures, or other logical constructs. Such instructions may be implemented to perform a task, implement a data type, transform the state of one or more devices, or otherwise arrive at a desired result. Processor 102 may include one or more processors that are configured to execute software instructions. Additionally or alternatively, processor 102 may include one or more hardware or firmware logic machines configured to execute hardware or firmware instructions. Processors of the processor 102 may be single or multi-core, and the programs executed thereon may be configured for parallel or distributed processing. The processor 102 may optionally include individual components that are distributed throughout two or more devices, which may be remotely located and/or configured for coordinated processing. One or more aspects of the processor 102 may be virtualized and executed by remotely accessible networked computing devices configured in cloud computing configuration.

Memory 104 may include one or more physical, non-transitory devices configured to hold data and/or instructions executable by the processor 102 to implement the herein described methods and processes. When such methods and processes are implemented, the state of memory 104 may be transformed (for example, to hold different data).

Memory 104 may include removable media and/or built-in devices. Memory 104 may include optical, magnetic, and/or solid-state memory devices. Memory 104 may include devices with one or more of the following characteristics: volatile, nonvolatile, dynamic, static, read/write, read-only, random access, sequential access, location addressable, file addressable, and content addressable. In some embodiments, processor 102 and memory 104 may be integrated into one or more common devices, such as an application-specific integrated circuit or a system on a chip.

When included, communication module 108 is configured to communicatively couple server 101 with one or more other computing devices, such as a user computing device 121 and/or one or more external resources 160. Communication module 108 may include wired and/or wireless communication devices compatible with one or more different communication protocols. As non-limiting examples, communication module 108 may be configured for communication via a wireless telephone network, a wireless local area network, a wired local area network, a wireless wide area network, a wired wide area network, and so on. In some embodiments, communication module 108 allows server 101 to send and/or receive messages to and/or from other devices via a network such as the public Internet. For example, communication module 108 may communicatively couple server 101 with user computing device 121 via the network 150. In some examples, the network 150 may be the public Internet. Furthermore, network 150 may be regarded as a private network connection and may include, for example, a virtual private network or an encryption or other security mechanism employed over the public Internet.

In one example, the server 101 includes an interactive home design tool application 105 configured as executable instructions in the memory 104. The interactive home design tool application 105 uses data from one or more databases 107 to generate and visualize a model of a custom designed home. The interactive home design tool application 105 further generates and visualizes the model of the custom designed home based on user input, thus providing the interactivity aspect of home design via the interactive home design tool application 105. In some examples, the data of the one or more databases 107 may be provided at an external resource 160, such as another server or remote storage device, which may be retrieved and/or updated via the network 150.

Computing environment 10 may include a plurality of devices 120 operated by users or clients, such as user computing device 121. User computing device 121 may be any computing device configured to access a network such as network 150, including but not limited to a personal computer, a laptop, a smartphone, a tablet, and the like.

User computing device 121 includes a processor 122 and a memory 124. User computing device 121 further includes a communication module 126, a display device 128, and a user input module 129.

Processor 122 may include one or more physical devices configured to execute one or more instructions. For example, processor 122 may be configured to execute one or more instructions that are part of one or more applications, services, programs, routines, libraries, objects, components, data structures, or other logical constructs. Such instructions may be implemented to perform a task, implement a data type, transform the state of one or more devices, or otherwise arrive at a desired result. Processor 122 may include one or more processors that are configured to execute software instructions. Additionally or alternatively, processor 122 may include one or more hardware or firmware logic machines configured to execute hardware or firmware instructions. Processors of the processor 122 may be single or multi-core, and the programs executed thereon may be configured for parallel or distributed processing. The processor 122 may optionally include individual components that are distributed throughout two or more devices, which may be remotely located and/or configured for coordinated processing. One or more aspects of the processor 122 may be virtualized and executed by remotely accessible networked computing devices configured in cloud computing configuration.

Memory 124 may include one or more physical, non-transitory devices configured to hold data and/or instructions executable by the processor 122 to implement the herein described methods and processes. When such methods and processes are implemented, the state of memory 124 may be transformed (for example, to hold different data). Memory 124 may include removable media and/or built-in devices. Memory 124 may include optical, magnetic, and/or solid-state memory devices. Memory 124 may include devices with one or more of the following characteristics: volatile, nonvolatile, dynamic, static, read/write, read-only, random access, sequential access, location addressable, file addressable, and content addressable. In some embodiments, processor 122 and memory 124 may be integrated into one or more common devices, such as an application-specific integrated circuit or a system on a chip.

When included, communication module 126 is configured to communicatively couple user computing device 121 with one or more other computing devices, such as server 101. Communication module 126 may include wired and/or wireless communication devices compatible with one or more different communication protocols. As non-limiting examples, communication module 126 may be configured for communication via a wireless telephone network, a wireless local area network, a wired local area network, a wireless wide area network, a wired wide area network, and so on. In some embodiments, communication module 126 allows user computing device 121 to send and/or receive messages to and/or from other devices via a network such as the public Internet. For example, communication module 126 may communicatively couple user computing device 121 with server 101 via the network 150. In some examples, the network 150 may be the public Internet. Furthermore, network 150 may be regarded as a private network connection and may include, for example, a virtual private network or an encryption or other security mechanism employed over the public Internet.

When included, display device 128 may be used to present a visual representation of data held by memory 124. As the herein described methods and processes change the data held by the memory 124, and thus transform the state of the memory 124, the state of display device 128 may likewise be transformed to visually represent changes in the underlying data. Display device 128 may include one or more display devices utilizing virtually any type of display technology. Such display devices may be combined with processor 122 and/or memory 124 in a shared enclosure, or such display devices may be peripheral display devices.

In one example, the user computing device 121 may include executable instructions 125 in the memory 124 that when executed by the processor 122 cause the processor 122 to perform various actions as described further herein. As one example, the user computing device 121 may be configured, via the instructions 125, to receive data for visualizing a custom designed home, display a visualization of the custom designed home via a graphical user interface on the display device 128 to a user, and receive interactive feedback and input regarding the custom designed home via the user input module 129.

The user input module 129 may include user input devices such as keyboards, mice, game controllers, cameras, microphones, and/or touch screens. A user of user computing device 121 may input specifications and selections regarding a custom designed home, for example, via user input module 129. As discussed further herein, user computing device 121 may transmit, via communication module 126, user input received via the user input module 129 to the server 101 over the network 150. In this way, server 101 may return data for designing and visualizing a custom designed home to the user computing device 121 for interactively designing a custom home based on user input.

Thus, server 101 and user computing device 121 may each represent computing devices which may generally include any device that is configured to perform computation and that is capable of sending and receiving data communications by way of one or more wired and/or wireless communication interfaces. Such devices may be configured to communicate using any of a variety of network protocols. For example, user computing device 121 may be configured to execute a browser application that employs HTTP to request information from server 101 and then displays the retrieved information to a user on a display such as the display device 128. Example interfaces that may be delivered to the user computing device 121 from the server 101 in such a manner and displayed, for example on display device 128 are described further herein and with regard to FIGS. 7-19.

Figure 2:
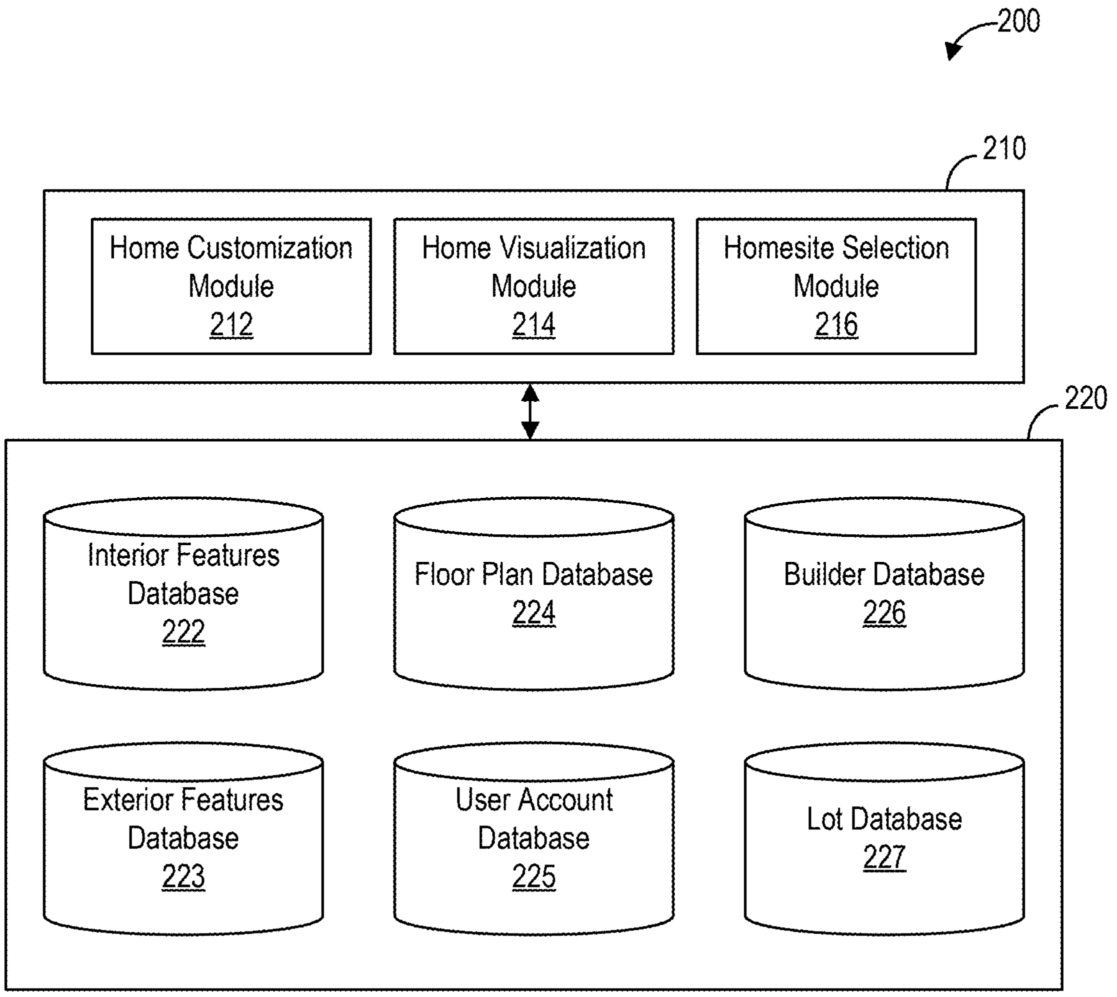
FIG. 2 shows a block schematic diagram illustrating an example architecture for an interactive home design tool.

FIG. 2 shows an exemplary arrangement of software modules and databases for an interactive home design tool 200. As depicted, the interactive home design tool 200 comprises an application layer 200 and a database layer 220. The interactive home design tool 200 may be implemented, as an illustrative example, in the memory 104 of a server 101. For example, the application layer 210 may be implemented as instructions in the memory 104 of the server 101, such as the interactive home design tool application 105, while the database layer 220 is implemented as one or more databases 107 in the memory 104 of the server and/or in memory of an external resource 160 communicatively coupled to the server 101 via a network 150.

Application layer 210 comprises a home customization module 212, home visualization module 214, and homesite selection module 216. Application layer 210 enables interactive home design and provides best-fit homesite selection for users by generating and updating graphical user interfaces for home customization, evaluating user selections, calculating fit scores for lots according to user selections, and performing other actions as described herein. Application layer 210 transmits and receives data from one or more database of database layer 220.

Home customization module 212 is configured to provide a user of a user computing device with interior and exterior customization options for a home design, and receive user selections. To that end, home customization module 212 is configured to output a plurality of interior features and a plurality of exterior features for transmission to a user computing device and display to a user via a display device of the user computing device. Home customization module 212 retrieves such interior features and exterior features from the database layer 220, such as from an interior features database 222 and an exterior features database 223 of the database layer 220. Home customization module 212 provides user selections of home customization options to home visualization module 214 for visualization. Further, home customization module 212 receives designations from users of whether a selected option is priority or non-priority, such that the customized home design requires the selected option if the option is designated as priority or the option may be omitted or substituted with an alternative option if the option is designated as non-priority. Home customization module 212 may determine one or more alternative options, including omission of the option, for a selected option designated as non-priority.

Home visualization module 214 generates interior and exterior visualizations of a home according to a plurality of user selections. Home customization module 212 may selectively output interior features and exterior features, such as a subset of interior features and/or exterior features, to a user according to prior selections or constraints, such as architectural and/or design themes. Home customization module 212 further receives one or more selections of interior features and/or exterior features from a user computing device, and home visualization module 214 generates a visualization of an interior and/or exterior according to the one or more selections. Further, home customization module 212 may automatically adapt the plurality of interior features and/or the plurality of exterior features available for selection by the user according to the one or more selections. Such automatic adaptation may occur in order to provide architectural design consistency in accordance with the one or more selections, and/or to accommodate any constraints on the design imposed by the one or more selections. The home visualization module 212 thus updates the visualization of the interior and the exterior of a home according to and responsive to user selections, thereby allowing a user to quickly design and customize a home design according to their preferences.

Homesite selection module 216 is configured to identify a best fit homesite or lot for a user according to the customized home design created by the user. Homesite selection module 216 evaluates the customized home design, comprising a floor plan selection and a plurality of options, to identify lot-limiting options and non-lot-limiting options of the customized home design from the combination of the floor plan selection and the plurality of options. Lot-limiting options comprise characteristics of the customized home design that interact with the lot itself or otherwise affect the potential of the customized home design being placed on a particular lot, and thus potentially reduce the number of available lots in a community that the home could be built on. As illustrative and non-limiting examples, lot-limiting options may include floor plan (e.g., due to anti-monotony rules or lot-fit), exterior elevation (e.g., due to anti-monotony rules), garage orientation (e.g., left or right garage due to anti-monotony rules), garage extension, three-car garage, recreational vehicle garage, recreational vehicle pad, covered patio, fireplace (e.g., when combined with other options), additional rooms (e.g., additional bedroom/den, when combined with other options), exterior paint scheme (e.g., due to anti-monotony rules), and so on. Non-lot-limiting options, in contrast, comprise characteristics of the customized home design that, when selected, cannot reduce the number of available lots in a community that the customized home design could be built on. As illustrating and non-limiting examples, non-lot-limiting options may include additional windows, fencing and landscaping, interior paint scheme, flooring selections, surface selections, cabinetry selections, trim selections, appliance selections, and so on.

Homesite selection module 216 further evaluates the customized home design to identify lot attributes selected by the user. Lot attributes comprise characteristics of a homesite or lot that may be of interest to the user. As illustrative and non-limiting examples, lot attributes may include a corner location, adjacency to common space, adjacency to green space, lot size, and view.

Homesite selection module 216 evaluates available lots in view of the lot-limiting options and the lot attributes of the customized home design and calculates best-fit scores for each available lot, where a lot that allows more of the lot-limiting options and lot attributes is assigned a higher best-fit score, while another lot that allows fewer of the lot-limiting options and/or lot attributes is assigned a lower best-fit score. Home selection module 216 evaluates available lots in a community selected by the user for the customized home design. Further, home selection module 216 evaluates available lots in other communities not selected by the user for the customized home design. In this way, a different community that may have an available lot with a higher best-fit score than available lots in the selected community may be presented to the user as potential homesites.

Database layer 220 comprises a plurality of databases storing data for use by the application layer 210 to provide home customization, home visualization, and homesite selection. The plurality of databases of the database layer 220 may include, as illustrative and non-limiting examples, interior features database 222, exterior features database 223, floor plan database 224, user account database 225, builder database 226, and lot database 227. Interior features database 222 stores a plurality of options for interior features of a home. Interior features database 222 may further store data for visualizing the interior features, such as textures and wireframes. Exterior features database 223 stores a plurality of options for exterior features of a home. Exterior features database 223 may further store data for visualizing the exterior features, such as textures and wireframes. Floor plan database 224 stores a plurality of options for floor plans of a home. User account database 225 stores buyer profiles for users (e.g., name, contact information, preferred floor plan, preferred lot characteristics). Builder database 226 stores lot characteristics, such as community name, allowed floor plans, oversized lot, corner lot, adjacency to common area, adjacency to green area, anti-monotony rules for the community, and so on. Lot database 227 stores data regarding available lots in all communities, such as lot identifiers, lot options, lot characteristics, and so on.

Figure 3:
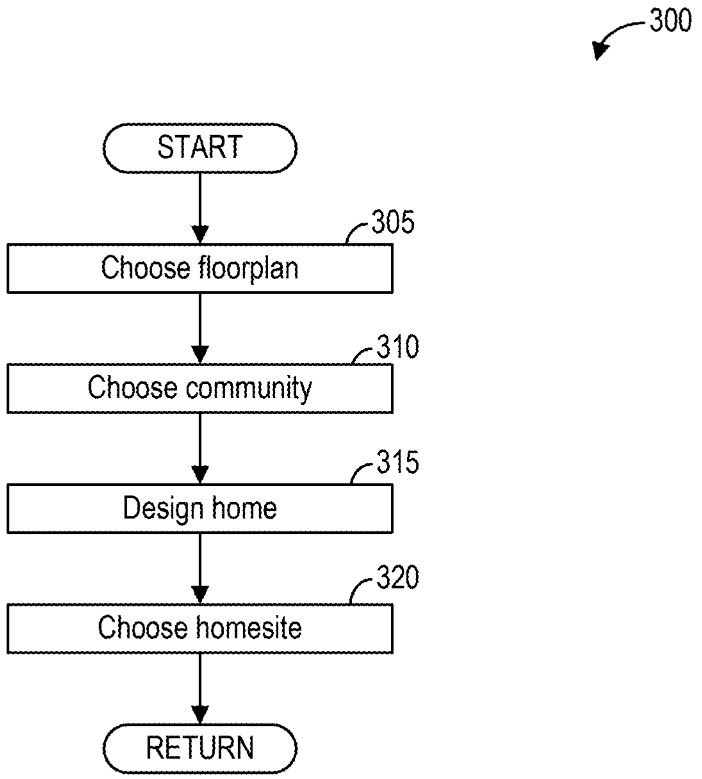
FIG. 3 shows a high-level flow chart illustrating an example method for interactively designing a home for a user.

FIG. 3 shows a high-level flow chart illustrating an example method 300 for interactively designing a home for a user. Method 300 specifically relates to the high-level process for a user designing and purchasing a customized home via an interactive home design tool. Method 300 is described with regard to the systems and components of FIGS. 1 and 2, though it should be appreciated that the method 300 may be implemented with other systems and methods without departing from the scope of the present disclosure. For example, method 300 may be implemented via the instructions 125 in memory 124 of a user computing device 121, which enables interactive of the user with the interactive home design tool 200, as an illustrative example, and thus the interactive home design tool application 105 stored as executable instructions in memory 104 of a server 101.

Method 300 begins at 305. At 305, a user chooses a floor plan from a plurality of available floor plans provided by a builder. The available floor plans are displayed to the user in a graphical user interface via display device 128.

At 310, the user chooses a community from a plurality of communities. Each community of the plurality of communities may be associated with a homebuilder. Further, each community of the plurality of communities may include at least one available lot for building a custom home. The plurality of communities may be displayed to the user based on a geographic preference or selection by the user.

At 315, the user designs a home. The user designs the home by selecting a plurality of interior features and exterior features for the selected floor plan. The user may further design the home by selecting one or more options, such as additional rooms, garage(s), patios, porches, windows, and so on. A visualization of the home may be displayed to the user in a graphical user interface via the display device 128, where the visualization of the home visually depicts interior features and exterior features with the selected floor plan. The visualization updates responsive to user selection of one or more features.

At 320, the user chooses a homesite. Specifically, one or more potential homesites or lots may be displayed to the user in a graphical user interface via the display device 128, and thus be selected or chosen by the user, where the one or more potential homesites are determined to accommodate the user-designed home. One or more of the potential homesites may not accommodate all options of the user-designed home, but may be displayed to the user with the one or more potential homesites along with an indication of the omitted option(s) or with an indication of alternative options. For example, while the user may have designed the home with a four-car garage, if none of the available homesites can accommodate a four-car garage with the selected floor plan, other potential homesites that can accommodate the floor plan with a three-car garage may be displayed along with an indication that the homesite can accommodate a three-car garage as an alternative to the four-car garage. In this way, the user may view homesites that may completely accommodate the user-designed home as well as homesites that provide a close fit to the user-designed home. The homesites may be displayed to the user in the graphical user interface in an ordered presentation, with the homesite of best fit (e.g., achieving as many of the user selections in the user-designed home as possible) listed first. Method 300 then returns.

Thus, the interactive home design tool of the present disclosure enables a method for a user to proceed through the home customization process quickly and easily, without the need for detailed consultations with a design team or other representatives. Further, users can quickly visualize desired features and understand whether available homesites will accommodate them. In this way, potential custom-home buyers can quickly evaluate the tradeoffs of different home designs and iterate through the design process to find a home they would like to purchase.

Figure 4:
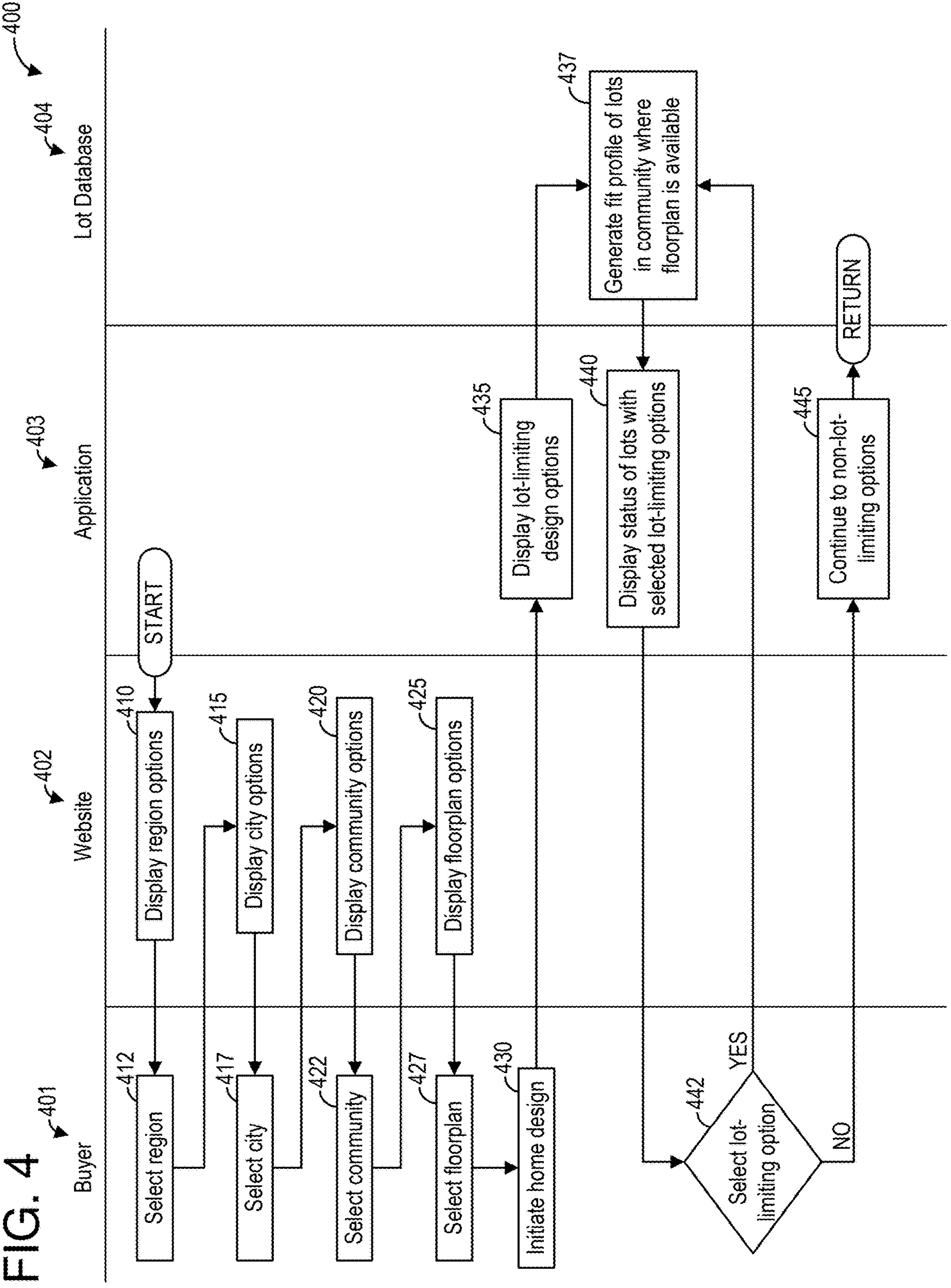
FIG. 4 shows a high-level swim-lane flow chart illustrating an example method for interactively establishing lot-limiting options for a home design.

FIG. 4 shows a high-level swim-lane flow chart illustrating an example method 400 for interactively establishing lot-limiting options for a home design. The method 400 relates to interactions between a buyer 401, a website 402, an application 403, and a lot database 404. The buyer 401 may be a user of a user computing device 121. The website 402 may comprise a browser application executed by the processor 122 of the user computing device 121 and providing a graphical user interface via a display device 128 of the user computing device 121. The application 403 may comprise the application layer 210 of the interactive home design tool 200 or interactive home design tool application 105, for example. The lot database 404 may comprise the lot database 227 stored as the database 107 in the server 101, for example, or alternatively may represent the interactions of the application layer 210 with the lot database 227 in the database layer 220. While the method 400 is described with regard to the systems and components of FIGS. 1-2, it should be appreciated that the method 400 may be implemented with other systems and components without departing from the scope of the present disclosure.

Method 400 begins at 410. At 410, the website 402 displays region options. At 412, the buyer 401 selects a region from the displayed region options. At 415, the website 402 displays city options according to the selected region. At 417, the buyer 401 selects a city from the displayed city options. At 420, the website 402 displays community options according to the selected city. At 422, the buyer 401 selects a community from the displayed community options. In this way, the buyer 401 begins the interactive home design process by designating a target geographic area and selecting a community.

At 425, the website 402 displays floor plan options available for the selected community. At 427, the buyer 401 selects a floor plan from the displayed floor plan options. At 430, the buyer 401 initiates home design for the selected floor plan. At 435, the application 403 displays lot-limiting design options (e.g., three-car garage, covered patio, and so on). At 437, the lot database 404 generates fit profiles of lots in the community where the floor plan is available. At 440, the application 403 displays the status of lots with selected lot-limiting options. For example, the application 403 displays which lots fit the selected lot-limiting options. At 442, the buyer 401 may select a lot-limiting option. If the buyer 401 selects a lot-limiting option ("YES"), method 400 returns to 437 to generate fit profiles of lots in the community where the floor plan is available and that fit the selected lot-limiting option, and these fit profiles are displayed via the application 403 at 440. Method 400 thus iterates in this way while the buyer 401 selects lot-limiting options. Once the buyer 401 is done selecting lot-limiting options at 442 ("NO"), method 400 continues to 445 where the application 403 allows the buyer 401 to select non-lot-limiting options. Method 400 then returns.

Thus, a method for interactive home design prompts users to perform limiting selections first and continuously updates available lots or homesites to reflect the user limiting selections. In this way, potential buyers can quickly determine the availability of homesites or lots for particular preferences or design choices that would reduce the number of available lots, prior to continuing further into the home design process.

Figure 5:
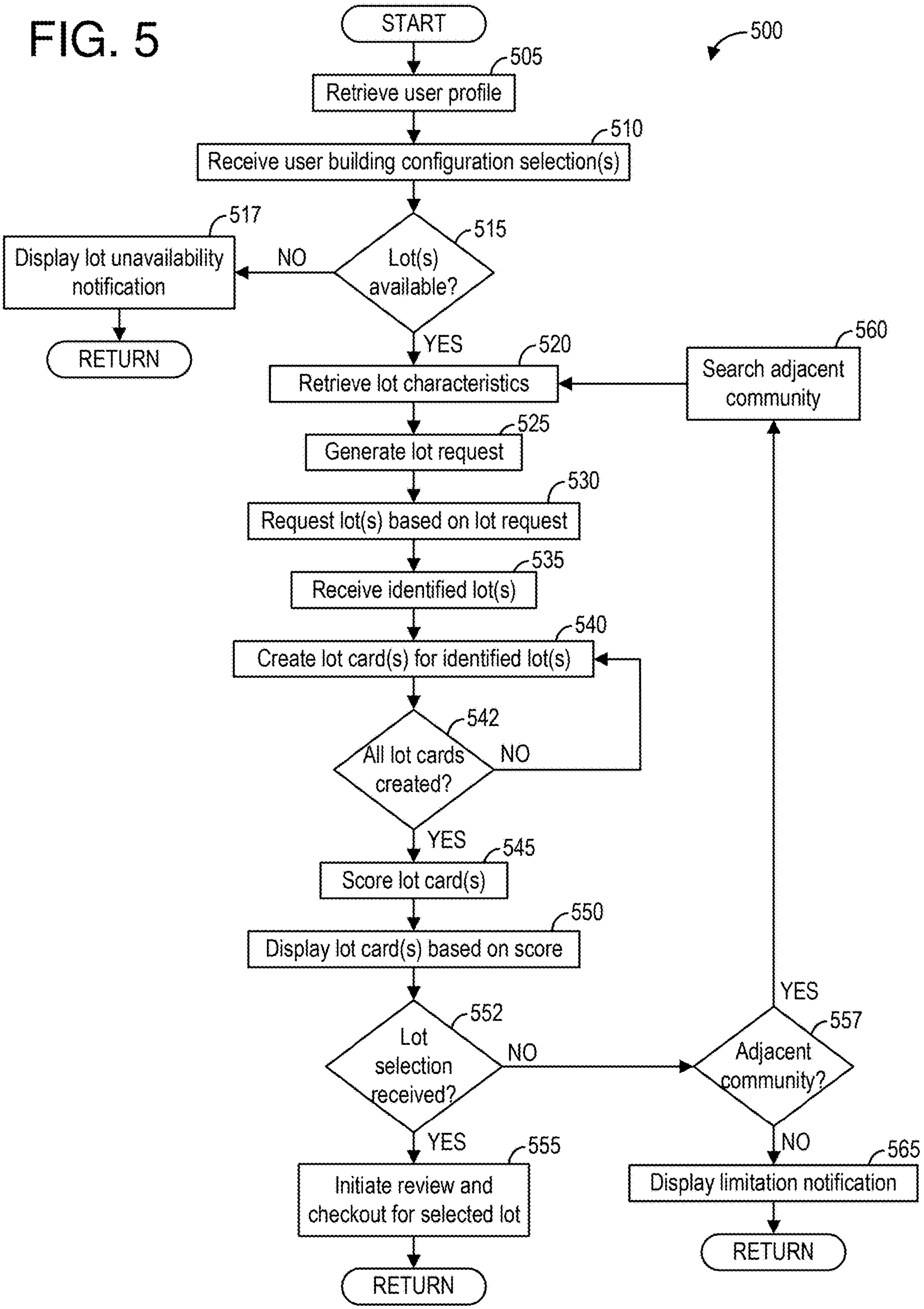
FIG. 5 shows a high-level flow chart illustrating an example method for interactively configuring a homesite for a custom home design.

FIG. 5 shows a high-level flow chart illustrating an example method 500 for interactively configuring a homesite for a custom home design. Method 500 relates to identifying suitable homesites for a customized home design. Method 500 is described with regard to the systems and components of FIGS. 1 and 2, though it should be appreciated that the method 500 may be implemented with other systems and components without departing from the scope of the present disclosure. Method 500 may be implemented with the interactive home design tool 200, for example, and as the interactive home design tool application 105 of the server 101.

Method 500 begins at 505. At 505, method 500 retrieves a user profile from a user profile or user account database, such as user account database 225. The user profile may include, as non-limiting examples, preferred floor plans and preferred lot characteristics for the user. The user profile may also include, as non-limiting examples, lot options such as priority lot options, non-priority lot options, and lot characteristics preferred by the user. These preferences may be saved in the user account based on previous selections by the user, as an example, and stored in the user account database 225 for quick retrieval.

At 510, method 500 receives user building configuration selections. The user building configuration selections may include, for example, the options saved in the user profile. Additionally or alternatively, the user building configuration selections may include new user selections of priority lot options, non-priority lot options, and lot characteristics.

At 515, method 500 determines whether one or more lots are available in a community indicated by the user building configuration selections. If no lots are available ("NO"), method 500 proceeds to 517. At 517, method 500 displays a lot unavailability notification to the user. Method 500 then returns.

However, if at least one lot is available at 515 ("YES"), method 500 continues to 520. At 520, method 500 retrieves lot characteristics for the available lot(s) from a builder database, such as the builder database 226. The lot characteristics for each lot include, for example, the community name associated with the lot, a lot identifier, allowed floor plans for the lot, a designation of whether the lot is oversized, a designation of whether the lot is a corner lot, a designation of whether the lot is adjacent to a common area or a green space, and so on.

At 525, method 500 generates a lot request. The lot request comprises, for example, a selected community, a selected floor plan, one or more selected priority lot options, one or more selected non-priority lot options, and any selected lot characteristics.

At 530, method 500 requests one or more lots based on the lot request. Method 500 may request the one or more lots from a lot database, such as the lot database 227, for example. At 535, method 500 receives identified lots, the identified lots identified based on the lot request in the lot database. Identifying the lots comprises, for example, identifying lots in the lot database matching the data in the lot request, such as community name, selected floor plan, requested lot options, and lot characteristics. The received identified lots may include, for each identified lot, a lot identifier (e.g., lot ID), lot options available for the lot, and lot characteristics of the lot. The received identified lots may include each lot that at least accommodates the selected floor plan, even if a lot does not accommodate any of the requested lot options.

At 540, method 500 creates a lot card for each identified lot. At 545, method 542 determines whether all lot cards are created. If not ("NO"), method 500 returns to 540 to continue creating lot cards for the identified lots. Once all lot cards are created at 542 ("YES"), method 500 continues to 545.

At 545, method 500 scores each lot card. The score of a lot card is determined based on the percentage of the requested lot options and lot characteristics for the selected floor plan that match the lot options and lot characteristics for the lot of the lot card. Thus, a lot matching all of the requested options and characteristics receives a high score, while a lot that matches only a portion of the requested options and characteristics receives a lower score, and a lot that matches only the selected floor plan and none of the requested options receives a lowest score.

At 550, method 500 displays the lot cards based on the score. For example, the lot cards may be displayed in descending order, with the lot card with the highest score displayed at the top and the lot card with the lowest score displayed at the bottom. Additionally or alternatively, the lot cards may be displayed based on the price. As an example, two lots with the same score but different prices for the building configuration may be displayed where the lower-priced lot is displayed higher than the higher-priced lot, or vice versa.

At 552, method 500 determines whether a lot selection is received. If a lot selection is received ("YES"), method 500 continues to 555. At 555, method 500 initiates a review and purchase checkout for the customized home configuration with the selected lot. Method 500 then returns.

Referring again to 552, if no lot selection is received ("NO"), method 500 may proceed to 557. At 557, method 500 determines whether there is an adjacent community with available lots. If there is an adjacent community with available lots ("YES"), method 500 proceeds to 560, where method 500 searches the adjacent community for the available lots. Method 500 then returns to 520 to retrieve lot characteristics, and repeat the process of creating and scoring lot cards for the lots in the adjacent community.

Referring again to 557, if there are no adjacent communities with available lots ("NO"), method 500 instead continues to 565, where method 500 displays a limitation notification indicating that there are no additional communities with available lots. Method 500 then returns.

Figure 6:
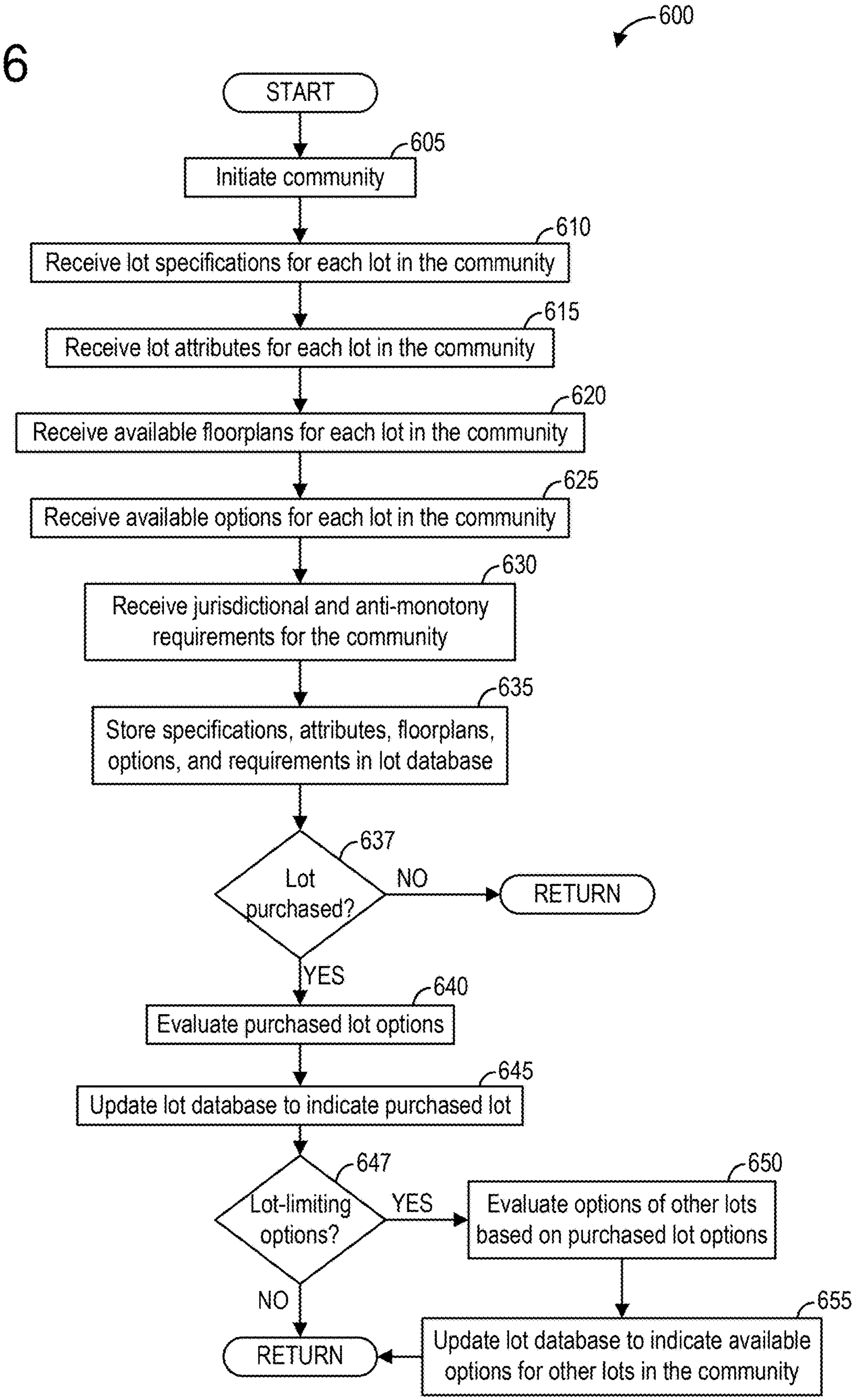
FIG. 6 shows a high-level flow chart illustrating an example method for creating and updating a lot database for an interactive home design tool.

FIG. 6 shows a high-level flow chart illustrating an example method 600 for creating and updating a lot database for an interactive home design tool. Specifically, method 600 relates to how users associated with a home builder may specify constraints on different lots in a community that are applied during an interactive home design process for buyers. Method 600 is described with regard to the systems and components of FIGS. 1 and 2, though it should be appreciated that the method 600 may be implemented with other systems and components without departing from the scope of the present disclosure. Method 600 may be implemented with the interactive home design tool 200, for example, and as the interactive home design tool application 105 of the server 101. Rather than a home buyer, the user of the user computing device 121 and/or the server 101 may be associated with a home builder or developer.

Method 600 begins at 605. At 605, method 600 initiates a community. Initiating a community may comprise generating a unique community identifier responsive to a user requesting initiation of a new community. For example, a user of a user computing device 121 may submit a request to the server 101 to initiate a new community, for example in a database 107. The initiating of a community may further comprise a specification of a number of lots in the community, geographical boundaries of the community, a name for the community, and so on. Initiating the community may therefore further include generating unique lot identifiers for each lot of the community. Thus, a community comprising a plurality of lots is initiated.

At 610, method 600 receives lot specifications for each lot in the community. Method 600 may receive the lot specifications for each lot from the user computing device 121, for example via the network 150. Lot specifications may include, for example, geographic boundaries of each lot, a base value for each lot, an address for each lot, and so on. Further, at 615, method 600 receives lot attributes for each lot in the community. Lot attributes may comprise, for example, characteristics of each lot that may be of interest to a buyer, such as a designation of whether a lot is in a corner location, whether a lot is adjacent to common space, whether a lot is adjacent to green space, a designation of the lot size, and a designation of whether and what type of view the lot features.

At 620, method 600 receives available floor plans for each lot in the community. For example, the shape and size of a lot may limit the number of floor plans that are possible in the lot. Further, at 625, method 600 receives available options for each lot in the community. Available options may specifically relate to lot-limiting options, which may similarly be limited based on the size and shape of a lot as well as based on the available floor plans. For example, a given lot may accommodate a first floor plan and a second floor plan. However, while the first floor plan may accommodate a first lot-limiting option (e.g., three-car garage) and a second lot-limiting option (e.g., covered patio), the second floor plan may only accommodate the second lot-limiting option because of the shape and size of the lot with respect to the second floor plan. Therefore, the available options for each floor plan may be provided for each lot.

Further, at 630, method 600 receives jurisdictional and anti-monotony requirements for the community. The jurisdictional and anti-monotony requirements for the community may limit the number of options and floor plans that may be adjacent to each other or within a specified distance of each other, and in this way prevent the community from acquiring a monotonous look due to repetitive implementations of the same floor plans and options.

At 635, method 600 stores the specifications, attributes, floor plans, options, and requirements in the lot database, such as the lot database 227. Thus, the various specifications and attributes for each lot in a community may be subsequently retrieved so that a user may interactively design a home and identify a homesite (i.e., lot) that accommodates their customized design.

At 637, method 600 determines whether a lot in the community is purchased. If no lot is purchased ("NO"), method 600 returns. However, if a lot is purchased ("YES"), method 600 proceeds to 640.

At 640, method 600 evaluates the purchased lot options, including the selected floor plan and lot-limiting options for the customized home of the purchased lot. At 645, method 600 updates the lot database to indicate the purchased lot. The lot database thus includes an indication that the lot is purchased, as well as the floor plan and any lot-limiting options associated with the purchased lot.

At 647, method 600 determines whether there are lot-limiting options. If not ("NO"), method 600 returns. However, if there are lot-limiting options ("YES"), method 600 instead continues to 650. At 650, method 600 evaluates options of other lots based on the purchased lot options. For example, based on jurisdictional and anti-monotony requirements for the community, method 600 may adjust which options (including floor plans and lot-limiting options) are available for other lots in the community based on the lot-limiting options of the purchased lot. At 655, method 600 updates the lot database to indicate available options for other lots in the community. Thus, as lots are purchased with different lot-limiting options, the lot database is updated to reflect these purchases and adjust the availability of different options for unpurchased lots. In this way, when a buyer uses the interactive home design tool described herein, which retrieves lot information from the lot database, the buyer is presented with the lot-limiting options that are properly available to them for a given lot and compliant with any jurisdictional and anti-monotony requirements of the community. Method 600 then returns.

Figure 7:
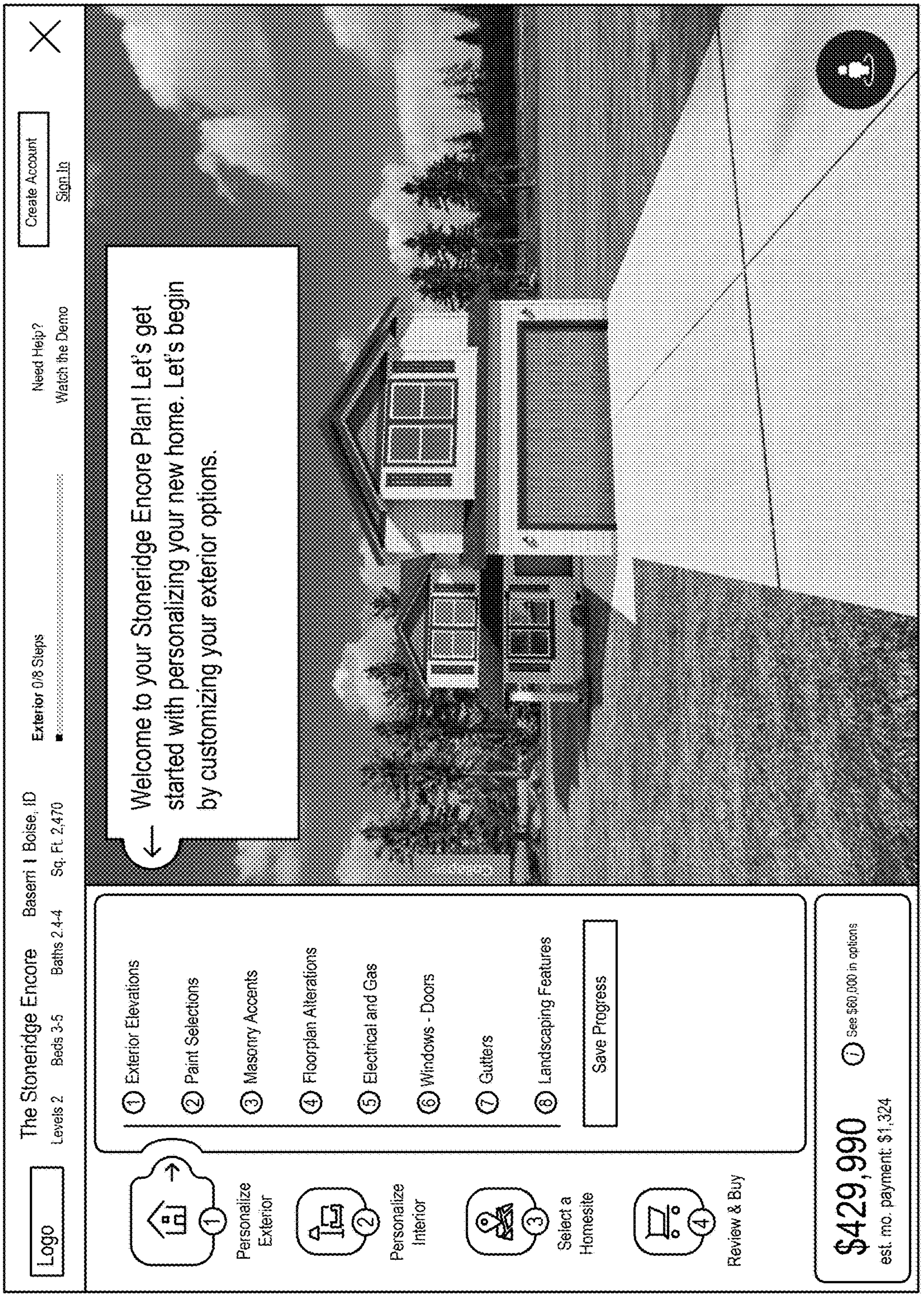
FIG. 7 shows an example graphical user interface for selecting and visualizing exterior options in an interactive home design tool.
Figure 8:
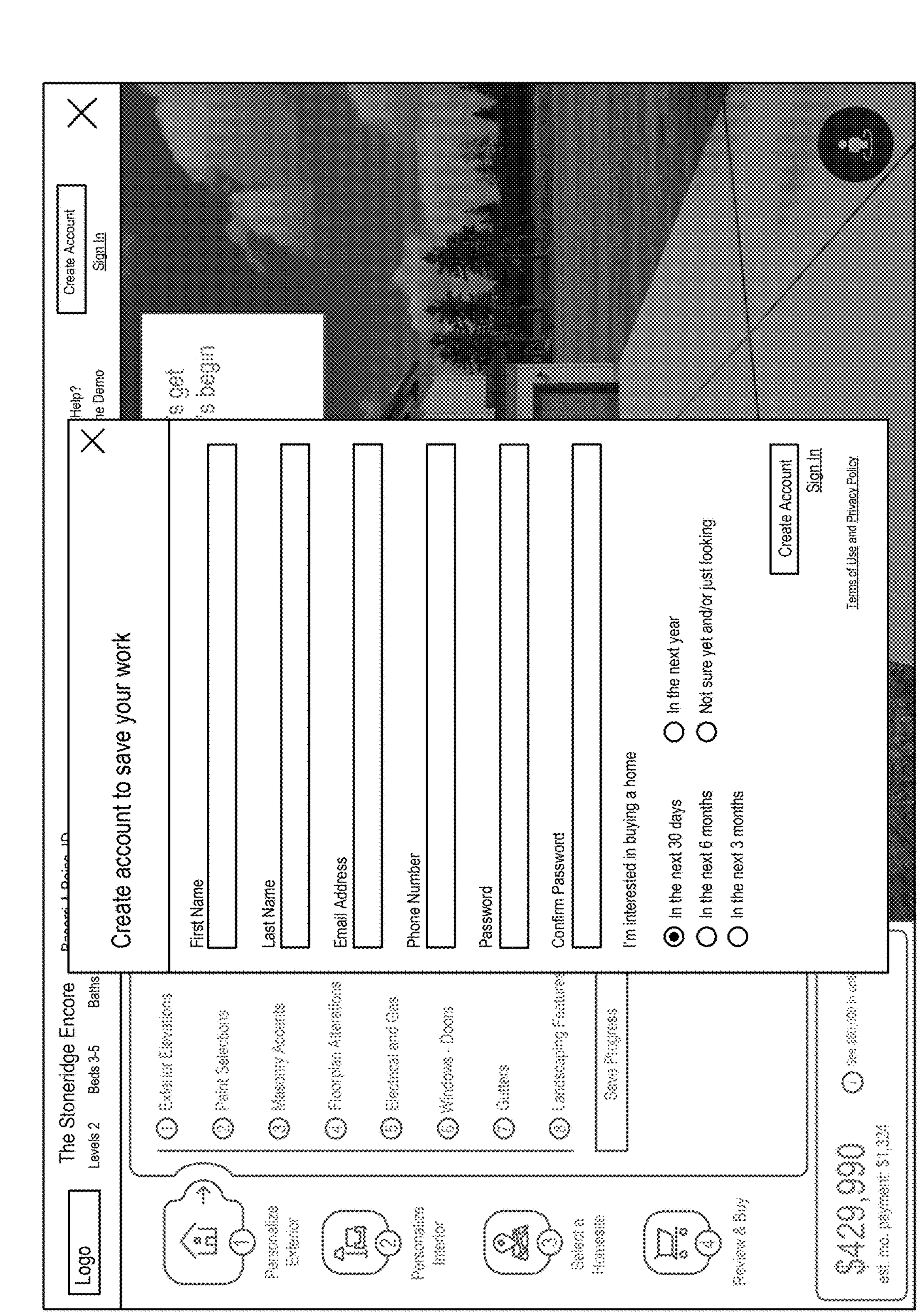
FIG. 8 shows an example graphical user interface for collecting user preferences in an interactive home design tool.

Thus, systems and methods for an interactive home design tool are provided. To illustrate these methods, FIGS. 7-19 show example graphical user interfaces that may be displayed to a user of the interactive home design tool. For example, FIG. 7 shows an example graphical user interface 700 for selecting and visualizing exterior options in an interactive home design tool. The graphical user interface 700 introduces the user to the interactive home design process. The graphical user interface 700, like all of the graphical user interfaces depicted in FIGS. 7-19, includes a header bar that displays basic information already selected by the user, such as community (e.g., Baserri), geographic location (e.g., Boise, ID), and floor plan (e.g., Stoneridge Encore). The header bar further displays a progress bar indicating the progress of the user through the interactive home design process. The graphical user interface 700 further includes a visualization of a default exterior for the selected floor plan, and a price overlay indicating estimated costs of purchased the customized home which may update throughout the process as the user selects different options. FIG. 8 shows an example graphical user interface 800 for collecting user preferences in an interactive home design tool. The user may enter basic information such as name, contact information, password, and contact preferences to create a user account. This information may be saved in a user profile or user account in the user account database 225, for example, so that the user may return to the interactive home design process to complete a home design or to revisit or edit a previously completed home design. Further, the user preferences enable the builder or developer to follow up with the user regarding their home design and their intentions to purchase a home.

Figure 9:
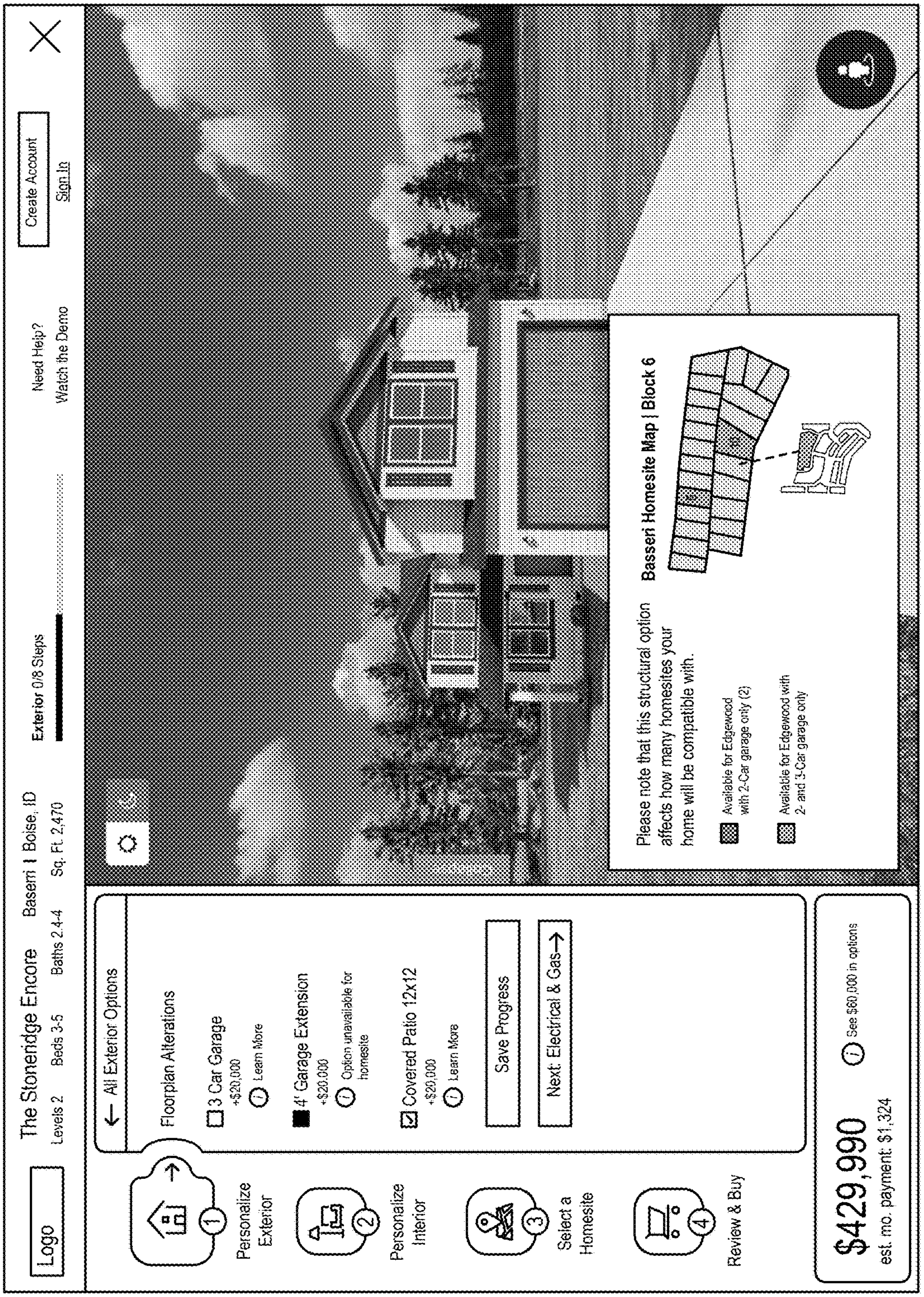
FIG. 9 shows an example graphical user interface for selecting and visualizing exterior options with limitations in an interactive home design tool.
Figure 10:
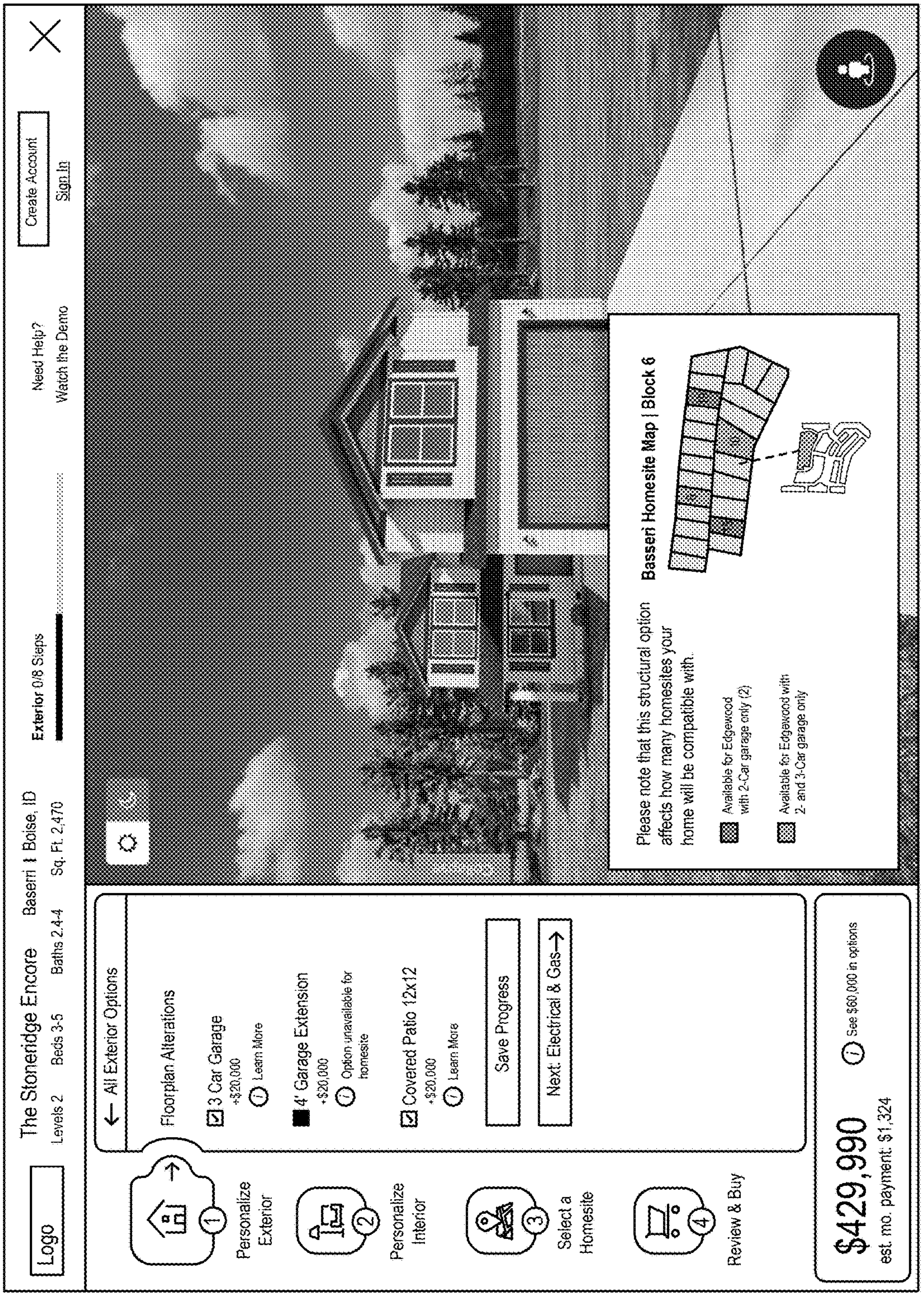
FIG. 10 shows an example graphical user interface for selecting and visualizing exterior options with adapted limitations in an interactive home design tool.

FIG. 9 shows an example graphical user interface 900 for selecting and visualizing exterior options with limitations in an interactive home design tool. The exterior options depicted in a sidebar overlay of the graphical user interface 900 relate to floor plan alterations which may comprise lot-limiting options as described herein. The graphical user interface 900 further includes an overlay depicting a map of the community, wherein the map indicates how a selected exterior option (e.g. a structural option) affects availability of lots in the community. For example, in the graphical user interface 900, the map overlay depicts which lots are available for a two-car garage and which lots are available for a two- or three-car garage. The example graphical user interface 1000 in FIG. 10 for selecting and visualizing exterior options illustrates how the interactive home design tool depicts adapted limitations responsive to user selections. In particular, the graphical user interface 1000 depicts an update to the map overlay responsive to the user selection of a three-car garage option.

Figure 11:
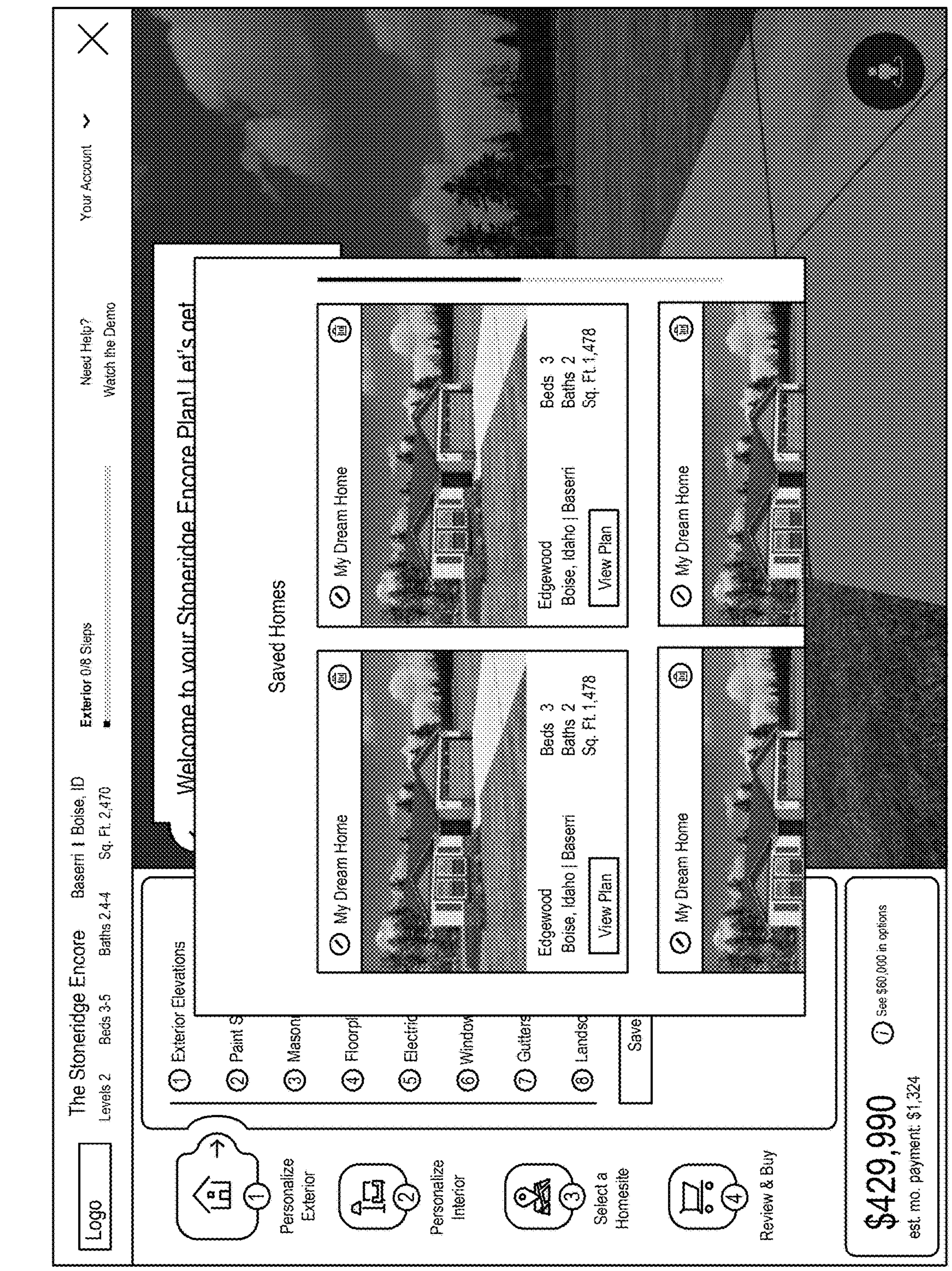
FIG. 11 shows an example graphical user interface for accessing custom designed homes.

FIG. 11 shows an example graphical user interface 1100 for accessing custom designed homes. Once a user creates a user account, the user may save a home design at any stage in their account for later access and retrieval. The graphical user interface 1100 depicts a Saved Homes overlay depicting different saved homes in a user account, which the allows the user to revisit the home design or delete a design from their account.

Figure 12:
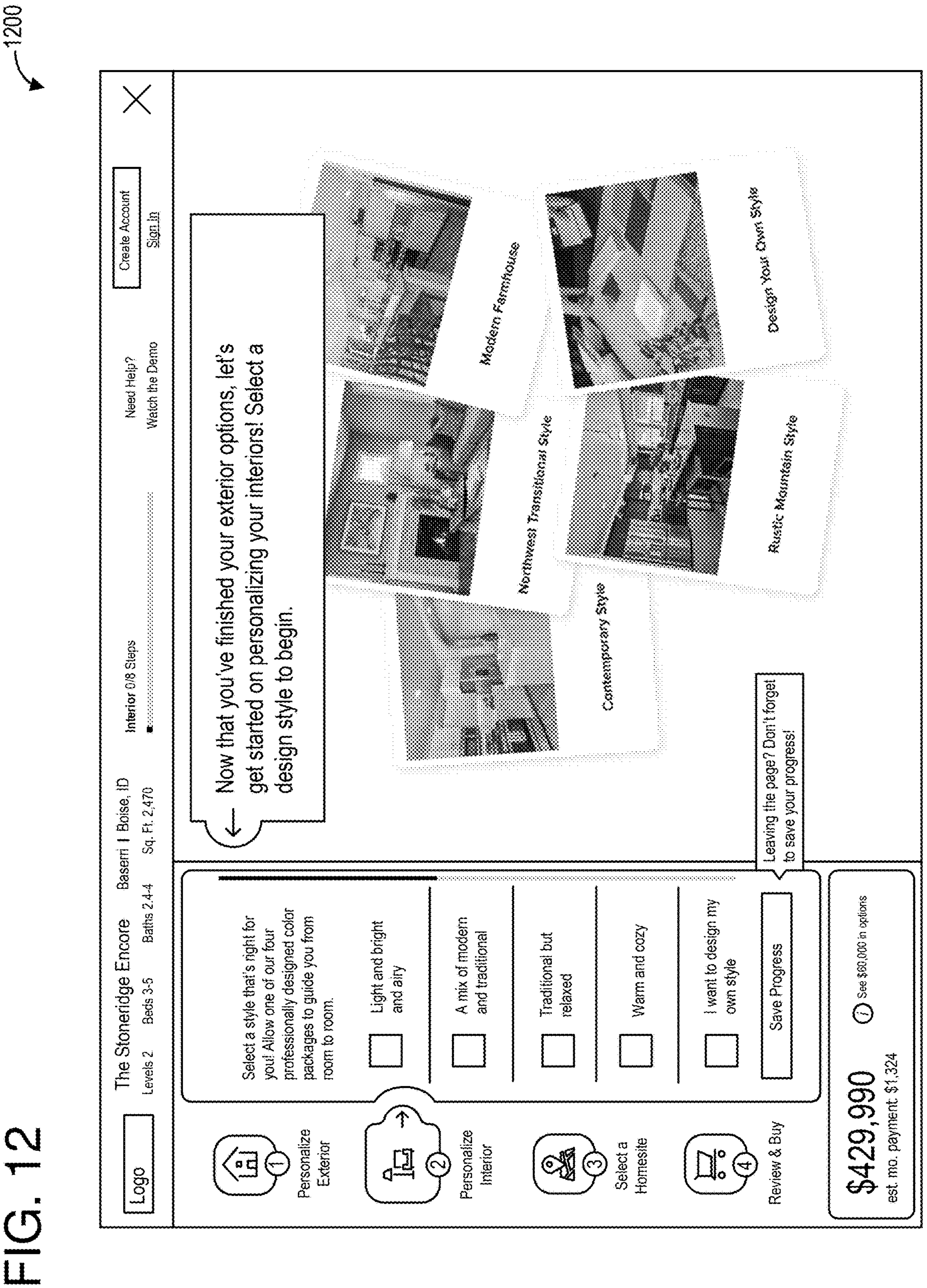
FIG. 12 shows an example graphical user interface for selecting interior options in an interactive home design tool.

FIG. 12 shows an example graphical user interface 1200 for selecting interior options in an interactive home design tool. The graphical user interface 1200 includes a sidebar overlay with different style options for the interior design of the home, which allows a user to easily select a unified interior theme (e.g., contemporary style, modern farmhouse, northwest transitional style, rustic mountain style, and so on) or alternatively to elect to select their own interior design options. Selection of a unified interior theme may provide default selections for interior design options which may be modified by a user.

Figure 13:
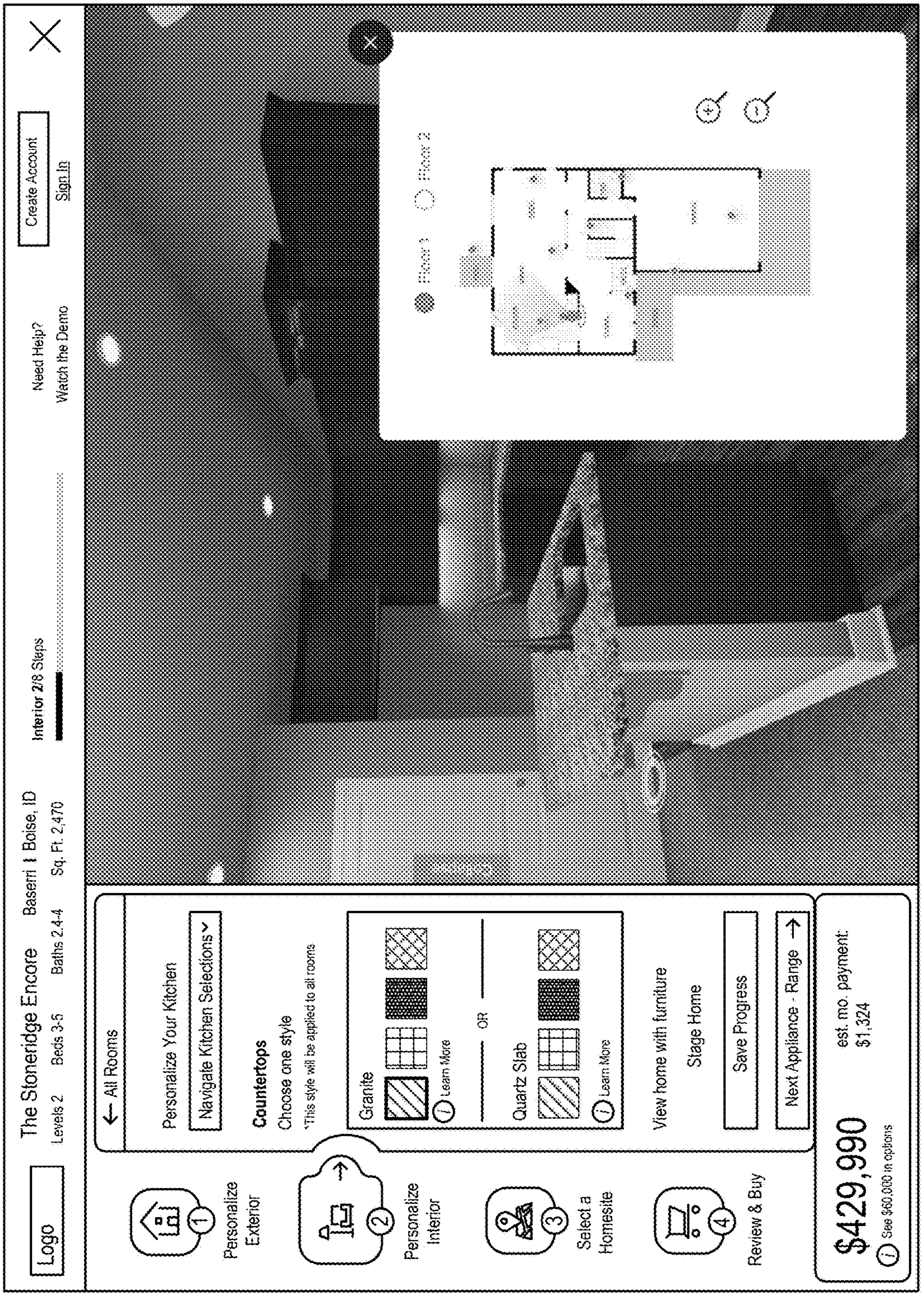
FIG. 13 shows an example graphical user interface for selecting and visualizing interior options in an interactive home design tool.
Figure 14:
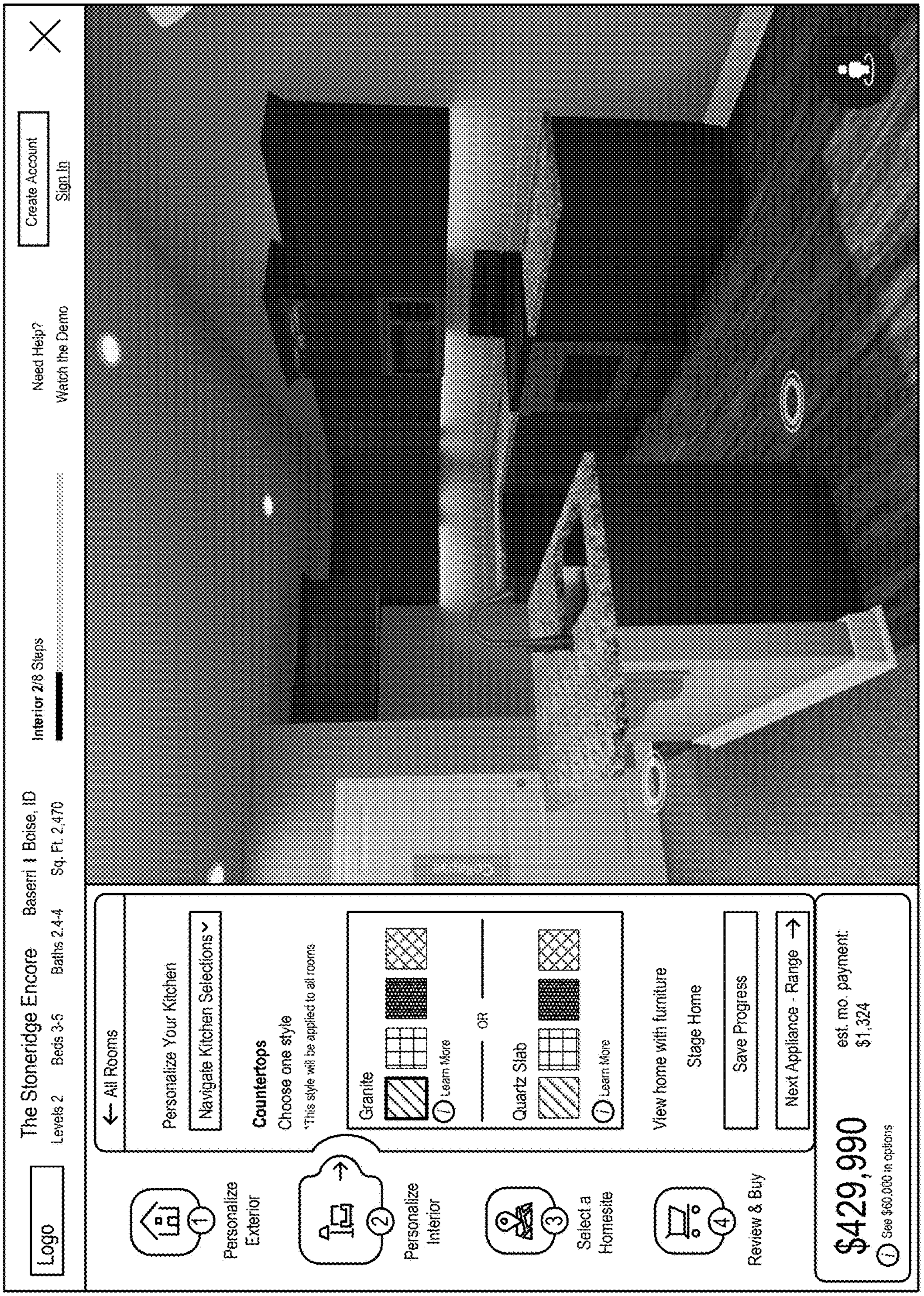
FIG. 14 shows another example graphical user interface for selecting and visualizing interior options in an interactive home design tool.

FIG. 13 shows an example graphical user interface 1300 for selecting and visualizing interior options in an interactive home design tool. The graphical user interface 1300 includes a visualization of an interior room in the home, wherein the visualization depicts a room with selected design options. The graphical user interface 1300 further includes a map overlay that depicts a location and perspective of the visualization, as well as alternative locations and perspectives available for visualization. The graphical user interface 1300 includes a sidebar depicting different interior options, such as different materials and styles for designing a home interior. As depicted in the graphical user interface 1400 of FIG. 14, the map overlay may be minimized so that it does not obstruct the visualization of the interior. The visualization of the interior updates as the user selects different options. In this way, the user can easily and quickly select design options for a plurality of options, visualize how they will look, understand the pricing of each option, and thus interactively customize their home design.

Figure 15:
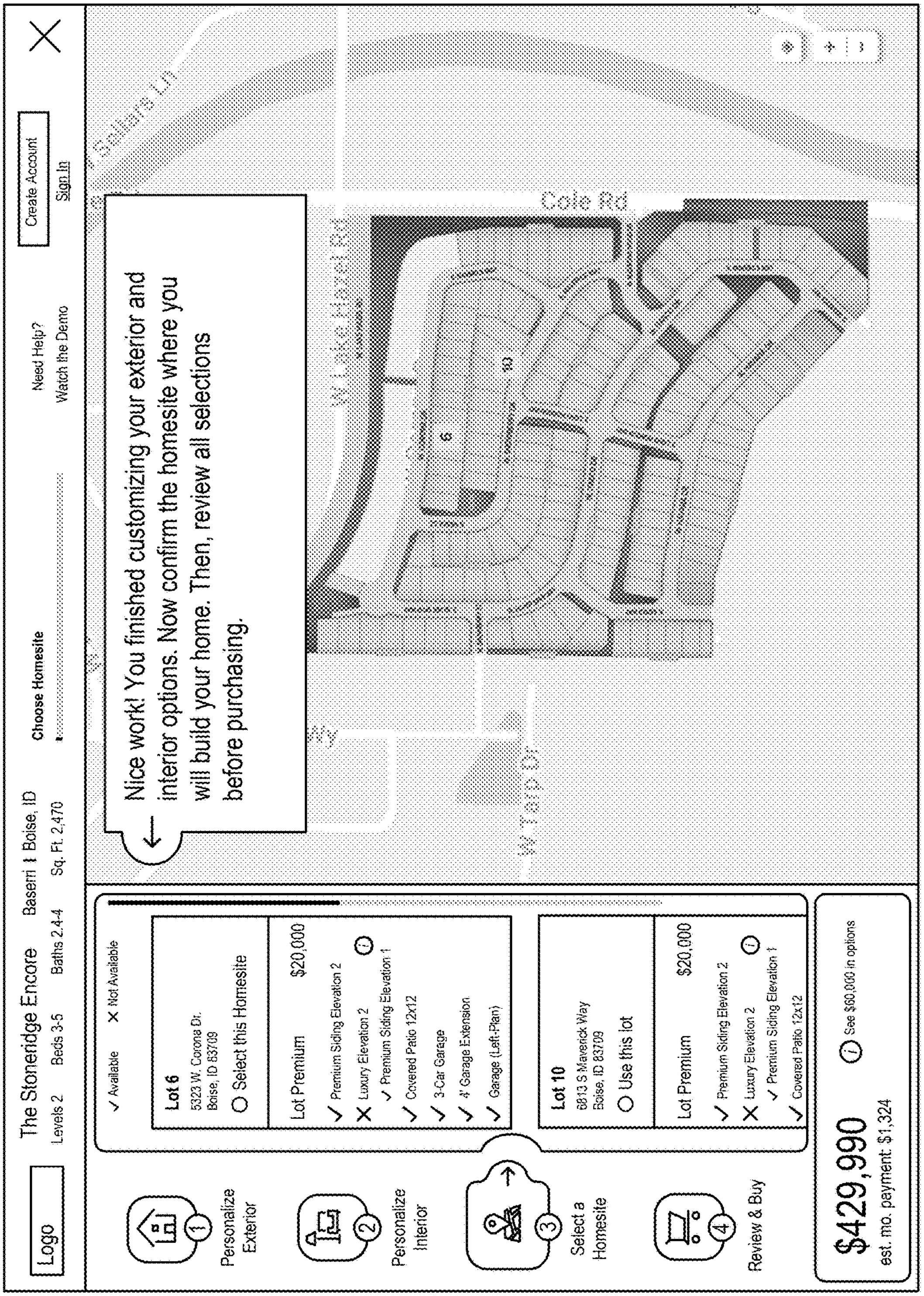
FIG. 15 shows an example graphical user interface for selecting a homesite for a custom designed home in a community in an interactive home design tool.

As described hereinabove, after the user is finished personalizing the exterior and interior of the home design, the interactive home design tool identifies one or more lots that may accommodate the customized home. FIG. 15 shows an example graphical user interface 1500 for selecting a homesite or lot for a custom-designed home in a community in an interactive home design tool. The graphical user interface 1500 depicts a map of the community and indicates which lots in the community are available for the customized home design. The graphical user interface 1500 includes a sidebar listing the lots by score. As depicted in FIG. 15, the score for each lot may not be displayed to the user. Instead, the score may be used to sort how the lots are displayed. For each lot listed in the sidebar, the graphical user interface 1500 depicts the lot-limiting options and an indication of whether they are available for the given lot (e.g., via a check mark or an x mark). The user may scroll through the sidebar to view additional lots and the lot-limiting options available for them.

Figure 16:
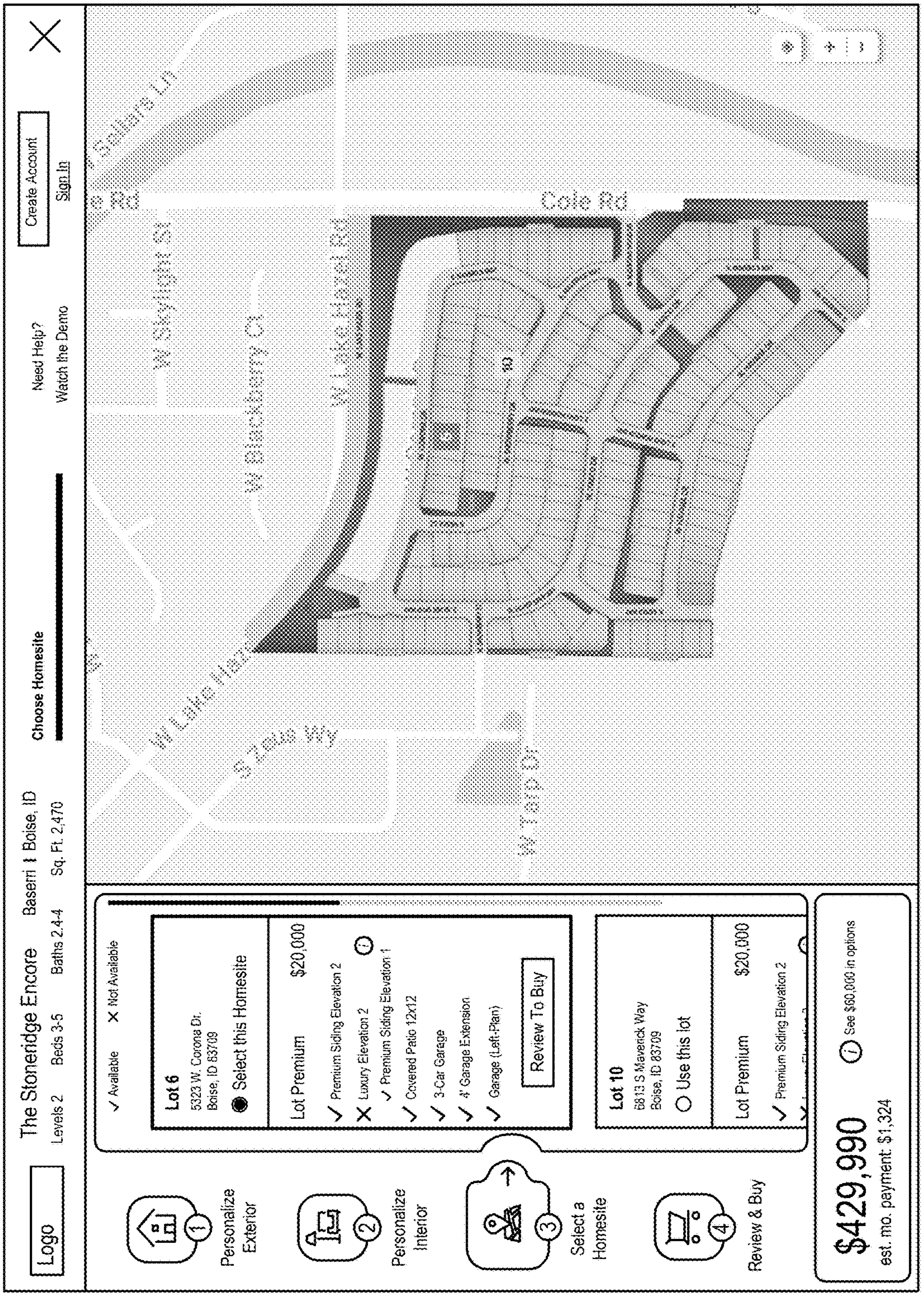
FIG. 16 shows another example graphical user interface for selecting a homesite for a custom designed home in a community in an interactive home design tool.

FIG. 16 shows another example graphical user interface 1600 for selecting a homesite for a custom designed home in a community in an interactive home design tool. Specifically, when a user selects a lot, the lot is highlighted in the map depicted in the graphical user interface 1600. The graphical user interface 1600 further updates the depicted lot card with a button allowing the user to proceed to purchasing the lot and the customized home, responsive to selection of the lot.

Figure 17:
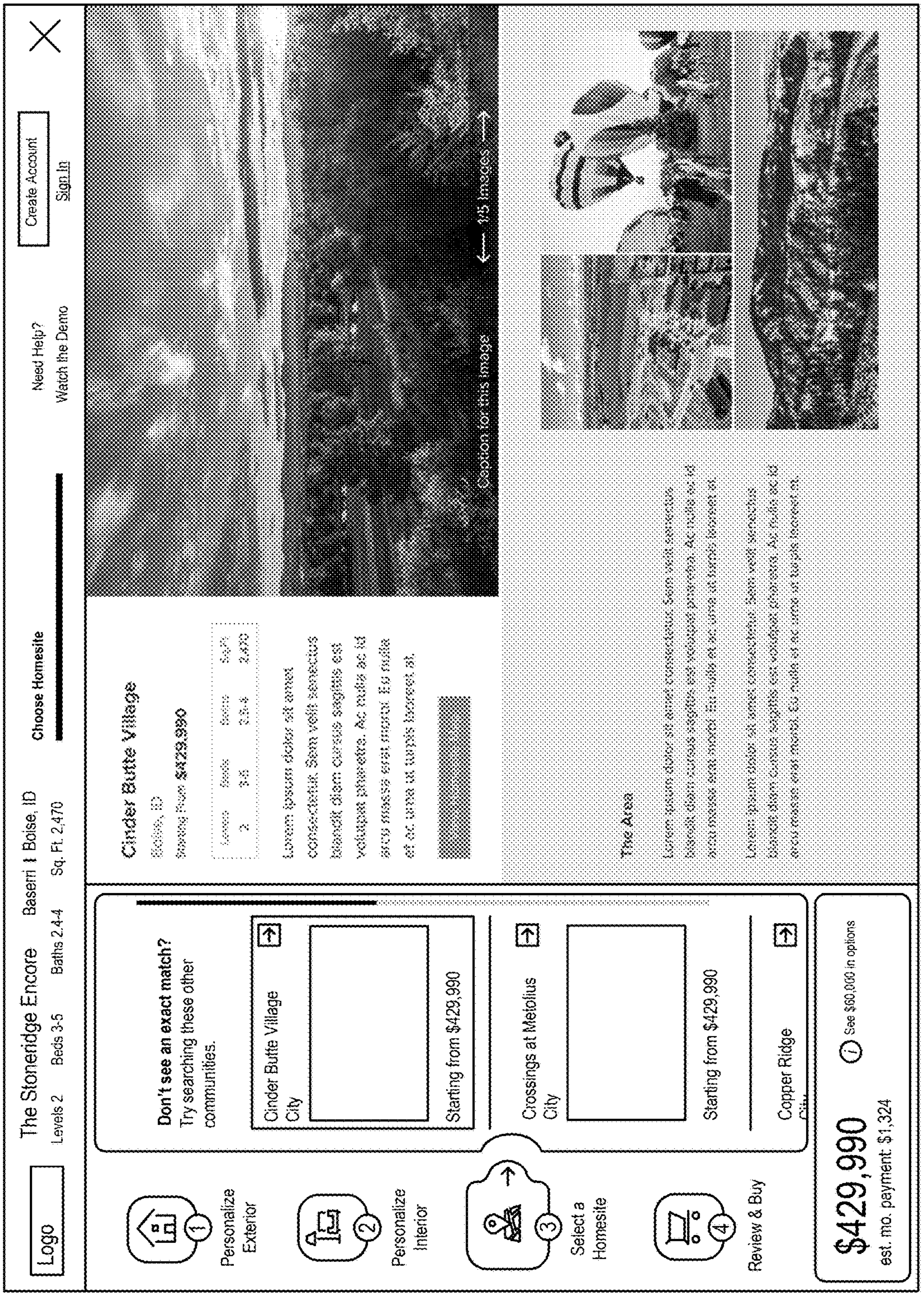
FIG. 17 shows an example graphical user interface for selecting alternative communities for a custom designed home in an interactive home design tool.

If the user is uninterested in any of the available lots for the customized home in the community, the interactive home design tool may allow the user to search other communities for an available lot that accommodates their customized home. FIG. 17 shows an example graphical user interface 1700 for selecting alternative communities for a custom designed home in an interactive home design tool. The graphical user interface 1700 includes description and photographs of communities that are located nearby the selected community. The graphical user interface 1700 further includes a sidebar listing the different communities that are located nearby the selected community. The user may scroll through the list of communities in the sidebar and select a given community to search the lots for that community. Once an alternative community is selected, the interactive home design tool evaluates the lots for that community to determine best-fit homesites for the customized home, as described hereinabove.

Figure 18:
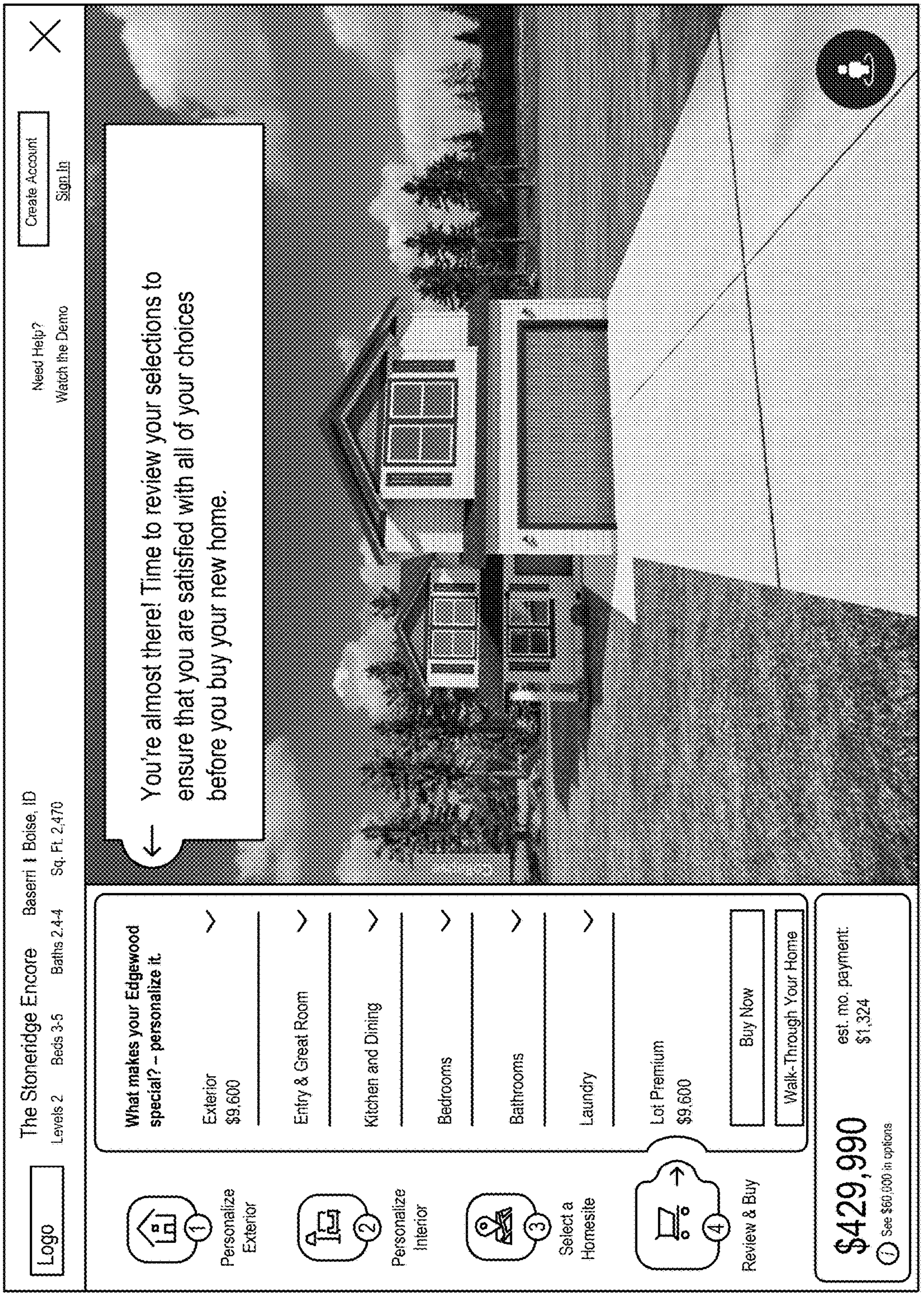
FIG. 18 shows an example graphical user interface for reviewing a custom designed home in an interactive home design tool.
Figure 19:
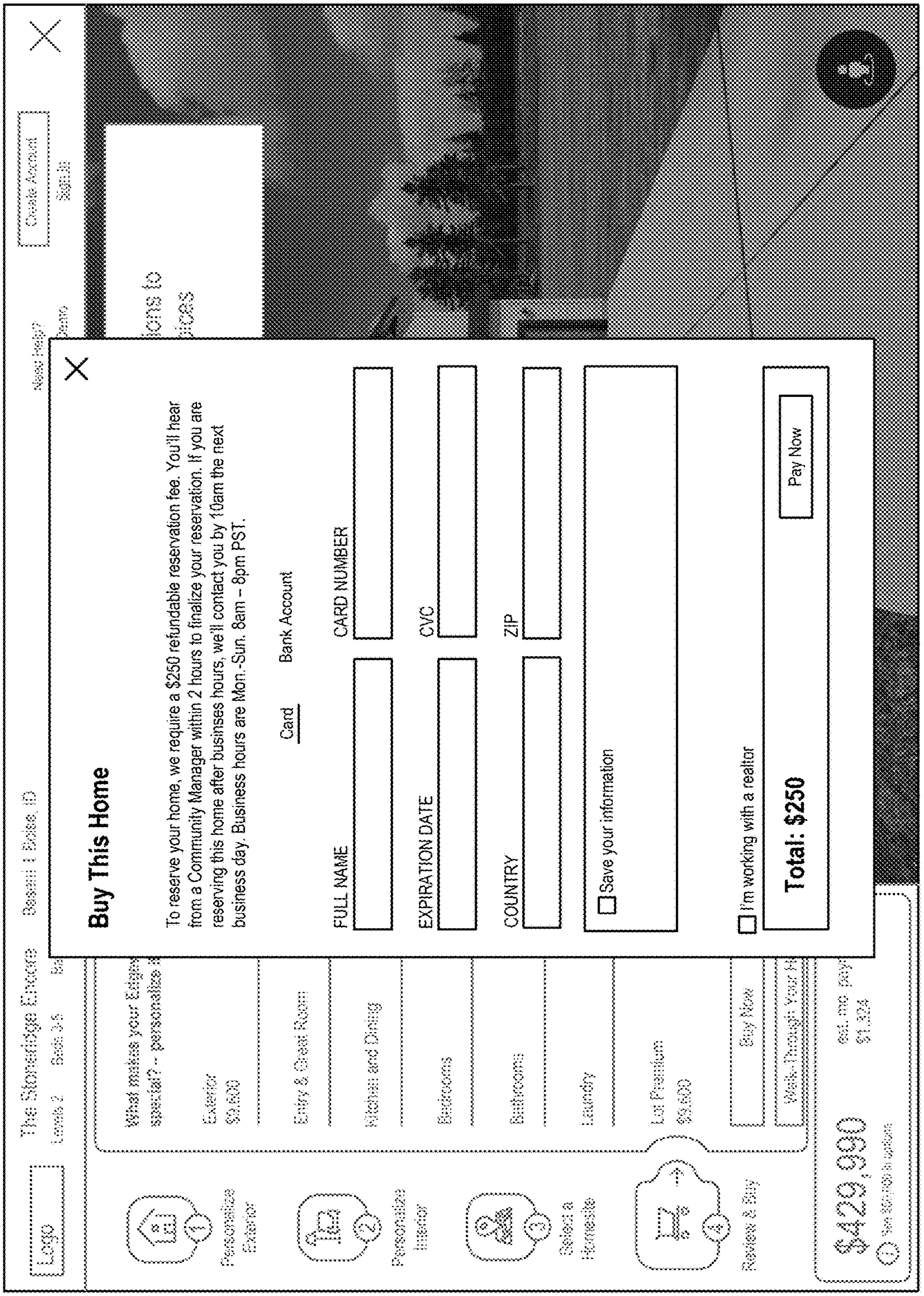
FIG. 19 shows an example graphical user interface for purchasing a custom designed home in an interactive home design tool.

Once the user finishes customizing a home design and selects a lot, the interactive home design tool allows the user to review the overall design and purchase both the lot and the customized home. FIG. 18 shows an example graphical user interface 1800 for reviewing a custom designed home in an interactive home design tool. The graphical user interface 1800 includes a visualization of the customized home design. The graphical user interface 1800 further includes a sidebar providing an overview of the different options and rooms, so that the user may easily review the customized home design. The graphical user interface 1800 further provides an option for the user to have a virtual walk-through of the home. The exterior visualization of the home in the graphical user interface 1800 may visualize the home in the selected lot, so that the user may understand how their home may look once built in its actual location. After the user finishes reviewing the home design, the user may proceed to purchase the customized home and lot. FIG. 19 shows an example graphical user interface 1900 for purchasing a custom designed home in an interactive home design tool. The graphical user interface 1900 provides a tool for purchasing or at least paying to reserve the customized home and lot.

Thus, systems and methods are provided for an interactive home design tool. In one example, a method for interactively designing a home comprises: receiving, from a user, a plurality of user selections for a home design; identifying, based on lot-limiting options of the plurality of user selections, a plurality of lots that are at least partially compatible with the lot-limiting options; determining, based on the lot-limiting options, a score for each lot of the plurality of lots, the score for each lot indicating a fit of each lot to the lot-limiting options; ordering the plurality of lots based on the score for each lot; and displaying, to the user, the ordered plurality of lots.

In a first example of the method, the method further comprises displaying, to the user, a plurality of exterior options and a plurality of interior options, wherein the plurality of user selections comprise a subset of the plurality of exterior options and the plurality of interior options. In a second example of the method optionally including the first example, the method further comprises displaying, to the user, a plurality of floor plan options, and receiving, from the user, a selection of a floor plan from the plurality of floor plan options, wherein the plurality of exterior options and the plurality of interior options displayed to the user are based on the selection of the floor plan. In a third example of the method optionally including one or more of the first and second examples, identifying the plurality of lots that are at least partially compatible with the lot-limiting options comprises querying a lot database for a list of lots in a community that accommodate a selected floor plan. In a fourth example of the method optionally including one or more of the first through third examples, determining the score for each lot of the plurality of lots comprises retrieving a list of lot-limiting options available for each lot, and calculating a percentage of the lot-limiting options selected by the user in the list of lot-limiting options available for each lot. In a fifth example of the method optionally including one or more of the first through fourth examples, the method further comprises receiving, from the user, a selection of a lot from the plurality of lots for purchase, wherein the lot is associated with a community. In a sixth example of the method optionally including one or more of the first through fifth examples, the method further comprises updating lot-limiting options available for other lots in the community based on the selection of the lot and the lot-limiting options of the plurality of user selections. In a seventh example of the method optionally including one or more of the first through sixth examples, updating the lot-limiting options available for other lots in the community comprises reducing lot-limiting options available for at least one lot in the other lots in the community. In an eighth example of the method optionally including one or more of the first through seventh examples, the method further comprises generating a visualization of the home design with the plurality of user selections. In a ninth example of the method optionally including one or more of the first through eighth examples, the method further comprises updating the visualization of the home design with the plurality of user selections to depict the home design on a selected lot of the plurality of lots, responsive to receiving a selection of the selected lot from the user.

In another example, a system for an interactive home design tool comprises: a user computing device; and a server communicatively coupled to the user computing device via a network, the server comprising a processor and a non-transitory memory configured with instructions that when executed by the processor cause the server to: receive, from the user computing device, a plurality of user selections for a home design; identify, based on lot-limiting options of the plurality of user selections, a plurality of lots that are at least partially compatible with the lot-limiting options; determine, based on the lot-limiting options, a score for each lot of the plurality of lots, the score for each lot indicating a fit of each lot to the lot-limiting options; order the plurality of lots based on the score for each lot; and transmit, to the user computing device for display to a user, the ordered plurality of lots.

In a first example of the system, the user computing device is configured to display, to the user via a display device of the user computing device, a plurality of exterior options and a plurality of interior options, wherein the plurality of user selections comprise a subset of the plurality of exterior options and the plurality of interior options. In a second example of the system optionally including the first example, the user computing device is further configured to display, to the user via the display device, a plurality of floor plan options, and the non-transitory memory is further configured with instructions that when executed by the processor cause the server to receive, from the user computing device, a selection of a floor plan from the plurality of floor plan options, wherein the plurality of exterior options and the plurality of interior options displayed to the user are based on the selection of the floor plan. In a third example of the system optionally including one or more of the first and second examples, to identify the plurality of lots that are at least partially compatible with the lot-limiting options, the non-transitory memory is further configured with instructions that when executed by the processor cause the server to query a lot database for a list of lots in a community that accommodate at least a selected floor plan. In a fourth example of the system optionally including one or more of the first through third examples, to determine the score for each lot of the plurality of lots, the non-transitory memory is further configured with instructions that when executed by the processor cause the server to: retrieve, from a database, a list of lot-limiting options available for each lot; and calculate a percentage of the lot-limiting options selected by the user in the list of lot-limiting options available for each lot. In a fifth example of the system optionally including one or more of the first through fourth examples, the non-transitory memory is further configured with instructions that when executed by the processor cause the server to: receive, from the user computing device, a selection of a lot from the plurality of lots for purchase, wherein the lot is associated with a community; and update, in a database, lot-limiting options available for other lots in the community based on the selection of the lot and the lot-limiting options of the plurality of user selections, wherein updating the lot-limiting options available for other lots in the community comprises reducing lot-limiting options available for at least one lot in the other lots in the community. In a sixth example of the system optionally including one or more of the first through fifth examples, the user computing device is configured to display a visualization of the home design with the plurality of user selections. In a seventh example of the system optionally including one or more of the first through sixth examples, the user computing device is further configured to update the visualization of the home design with the plurality of user selections to depict the home design on a selected lot of the plurality of lots, responsive to the user selecting the selected lot. In an eighth example of the system optionally including one or more of the first through seventh examples, the visualization is generated at one of the user computing device or the server based on one or more textures retrieved from a database.

In yet another example, one or more computer-readable media comprises computer-executable instructions that, when executed, cause a computing system to: receive, from a user, a plurality of user selections for a home design; identify, based on lot-limiting options of the plurality of user selections, a plurality of lots that are at least partially compatible with the lot-limiting options; determine, based on the lot-limiting options, a score for each lot of the plurality of lots, the score for each lot indicating a fit of each lot to the lot-limiting options; order the plurality of lots based on the score for each lot; and display, to the user, the ordered plurality of lots.

The disclosed methods, apparatus, and systems should not be construed as limiting in any way. Instead, the present disclosure is directed toward all novel and nonobvious features and aspects of the various disclosed embodiments, alone and in various combinations and sub-combinations with one another. The disclosed methods, apparatus, and systems are not limited to any specific aspect or feature or combination thereof, nor do the disclosed embodiments require that any one or more specific advantages be present or problems be solved.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

We claim:

1. A computer-implemented method for interactively designing a home, comprising:

receiving, at a server from a user computing device, a selection of a community and a selection of a floor plan from a plurality of floor plan options available for the selected community;

retrieving, by the server from one or more of a builder database storing lot characteristics and a lot database storing lot constraints, a plurality of lot-limiting options available for the selected floor plan in the selected community and a plurality of non-lot-limiting options;

transmitting, by the server to the user computing device for display via a graphical user interface, first graphical user interface data for displaying the plurality of lot-limiting options and the plurality of non-lot-limiting options;

receiving, at the server from the user computing device, a plurality of user selections for a home design, the plurality of user selections comprising one or more lot-limiting options selected from the plurality of lot-limiting options, one or more non-lot-limiting options selected from the plurality of non-lot-limiting options, and designations of priority options and non-priority options among the plurality of user selections;

identifying, by querying the builder database and the lot database based on the one or more selected lot-limiting options of the plurality of user selections, a plurality of lots that are at least partially compatible with the one or more selected lot-limiting options for the selected community;

determining, by the server based on the lot-limiting options, a score for each lot of the plurality of lots indicating a compatibility fit of each lot to the lot-limiting options, wherein the score for each lot of the plurality of lots is determined based on a percentage of selected lot options and selected lot characteristics for the selected floor plan that match lot options and lot characteristics for each lot;

ordering, by the server, the plurality of lots based on the score for each lot;

transmitting, by the server to the user computing device for display in a graphical user interface, second graphical user interface data for displaying the ordered plurality of lots;

responsive to receiving, at the server from the user computing device, a selection of a lot from the ordered plurality of lots, adjusting a three-dimensional visualization to depict the home design on the selected lot and to exclude incompatible user selections with the selected lot;

determining, by the server, that the selected lot is purchased, the selected lot purchased with the selected floor plan and one or more purchased lot-limiting options;

updating at least one of the builder database and the lot database to indicate the selected lot as unavailable and the selected floor plan and the one or more purchased lot-limiting options as associated with the selected lot; and updating at least one of the builder database and the lot database to adjust available floor plans and available lot-limiting options for unpurchased lots in the selected community according to community requirements.

2. The computer-implemented method of claim 1, further comprising transmitting, to the user computing device for display via the graphical user interface, third graphical user interface data for displaying a plurality of exterior options and a plurality of interior options, wherein the plurality of user selections comprise a subset of the plurality of exterior options and the plurality of interior options.

3. The computer-implemented method of claim 2, further comprising:

transmitting, to the user computing device for display via the graphical user interface, fourth graphical user interface data for displaying the plurality of floor plan options available for the selected community, wherein the plurality of exterior options and the plurality of interior options are based on the selection of the floor plan.

4. The computer-implemented method of claim 1, wherein the lot database stores available floor plans and available lot-limiting options for each lot in the selected community.

5. The computer-implemented method of claim 1, wherein adjusting the available lot-limiting options for unpurchased lots in the selected community comprises reducing at least one lot-limiting option available for at least one lot of the unpurchased lots in the selected community.

6. The computer-implemented method of claim 1, further comprising generating the three-dimensional visualization of exterior features and interior features of the home design with the plurality of user selections.

7. A system, comprising:

a server communicatively coupled to a user computing device via a network, the server comprising a processor and a non-transitory memory configured with instructions that when executed by the processor cause the server to:

receive, from the user computing device, a selection of a community and a selection of a floor plan from a plurality of floor plan options available for the selected community;

retrieve, from one or more of a builder database storing lot characteristics and a lot database storing lot constraints, a plurality of lot-limiting options available for the selected floor plan in the selected community and a plurality of non-lot-limiting options;

transmit, to the user computing device for display via a graphical user interface, first graphical user interface data for displaying the plurality of lot-limiting options and the plurality of non-lot-limiting options;

receive, from the user computing device, a plurality of user selections for a home design, the plurality of user selections comprising one or more lot-limiting options selected from the plurality of lot-limiting options, one or more non-lot-limiting options selected from the plurality of non-lot-limiting options, and designations of priority options and non-priority options among the plurality of user selections;

identify, by querying the builder database and the lot database based on the one or more lot-limiting options of the plurality of user selections, a plurality of lots that are at least partially compatible with the one or more lot-limiting options for the selected community;

determine, based on the lot-limiting options, a score for each lot of the plurality of lots, the score for each lot of the plurality of lots indicating a compatibility fit of each lot to the lot-limiting options, wherein the score for each lot is determined based on a percentage of selected lot options and lot characteristics for the selected floor plan that match lot options and lot characteristics for each lot;

order the plurality of lots based on the score for each lot;

transmit, to the user computing device for display in a graphical user interface, second graphical user interface data for displaying the ordered plurality of lots;

responsive to receiving, from the user computing device, a selection of a lot from the ordered plurality of lots, adjust a three-dimensional visualization to depict the home design on the selected lot and to exclude incompatible user selections with the selected lot;

determine that the selected lot is purchased, the selected lot purchased with the selected floor plan and one or more purchased lot-limiting options;

update at least one of the builder database and the lot database to indicate the selected lot as unavailable and the selected floor plan and the one or more purchased lot-limiting options as associated with the selected lot; and update at least one of the builder database and the lot database to adjust available floor plans and available lot-limiting options for unpurchased lots in the selected community according to community requirements.

8. The system of claim 7, wherein the non-transitory memory is further configured with instructions that when executed by the processor cause the server to transmit, to the user computing device for display, via the display device, fourth graphical user interface data for displaying a plurality of exterior options and a plurality of interior options, wherein the plurality of user selections comprise a subset of the plurality of exterior options and the plurality of interior options.

9. The system of claim 8, wherein the non-transitory memory is further configured with instructions that when executed by the processor cause the server to transmit, to the user computing device for display via the display device, fifth graphical user interface data for displaying the plurality of floor plan options, wherein the plurality of exterior options and the plurality of interior options displayed via the graphical user interface are based on the selected floor plan.

10. The system of claim 7, wherein, to identify the plurality of lots that are at least partially compatible with the one or more selected lot-limiting options, the non-transitory memory is further configured with instructions that when executed by the processor cause the server to query the lot database for a list of lots in a community that accommodate at least the selected floor plan.

11. The system of claim 7, wherein the non-transitory memory is further configured with instructions that when executed by the processor cause the server to:

receive, from the user computing device, the selection of the lot from the plurality of lots with an indication of a purchase of the lot; and update, in at least one of the builder database and the lot database, the available lot-limiting options for the other lots by reducing at least one lot-limiting option available for at least one lot in the other lots in the selected community.

12. The system of claim 7, wherein the user computing device is configured to display the three-dimensional visualization of the home design with the plurality of user selections.

13. The system of claim 12, wherein the three-dimensional visualization is generated at one of the user computing device or the server based on one or more textures retrieved from a database.

14. One or more non-transitory computer-readable media comprising computer-executable instructions that, when executed, cause a computing system to:

receive, from a user computing device, a selection of a community and a selection of a floor plan from a plurality of floor plan options available for the selected community;

retrieve, from one or more of a builder database storing lot characteristics and a lot database storing lot constraints, a plurality of lot-limiting options available for the selected floor plan in the selected community and a plurality of non-lot-limiting options;

transmit, to the user computing device for display via a graphical user interface, first graphical user interface data for displaying the plurality of lot-limiting options and the plurality of non-lot-limiting options;

receive, from the user computing device, a plurality of user selections for a home design, the plurality of user selections comprising one or more lot-limiting options selected from the plurality of lot-limiting options, one or more non-lot-limiting options selected from the plurality of non-lot-limiting options, and designations of priority options and non-priority options;

identify, by querying the builder database and the lot database based on the lot-limiting options of the plurality of user selections, a plurality of lots that are at least partially compatible with the one or more selected lot-limiting options for the selected community;

determine, based on the lot-limiting options, a score for each lot of the plurality of lots, the score for each lot indicating a compatibility fit of each lot to the lot-limiting options, wherein the score for each lot of the plurality of lots is determined based on a percentage of selected lot options and selected lot characteristics for the selected floor plan that match lot options and lot characteristics for each lot;

order the plurality of lots based on the score for each lot;

transmit, to the user computing device for display in the graphical user interface, second graphical user interface data for displaying the ordered plurality of lots;

responsive to receiving, from the user computing device, a selection of a lot from the ordered plurality of lots, adjust a three-dimensional visualization to depict the home design on the selected lot and to exclude incompatible user selections with the selected lot;

determine that the selected lot is purchased, the selected lot is purchased with the selected floor plan and one or more purchased lot-limiting options;

update at least one of the builder database and the lot database to indicate the selected lot as unavailable and the selected floor plan and the one or more purchased lot-limiting options as associated with the selected lot; and update at least one of the builder database and the lot database to adjust available floor plans and available lot-limiting options for unpurchased lots in the selected community according to community requirements.

15. The one or more non-transitory computer-readable media of claim 14, further comprising computer-executable instructions that, when executed, cause the computing system to:

receive, from a second user computing device after updating at least one of the builder database and the lot database to indicate the selected lot as purchased, a second selection of the community;

retrieve, from one or more of the builder database and the lot database, a second plurality of floor plans available for the unpurchased lots and a second plurality of lot-limiting options available for the unpurchased lots; and transmit, to the second user computing device for display via a second graphical user interface, third graphical user interface data for displaying the second plurality of floor plans and the second plurality of lot-limiting options.

* * * * *